(12) United States Patent
Lim et al.

(10) Patent No.: US 10,147,777 B2
(45) Date of Patent: Dec. 4, 2018

(54) DISPLAY DEVICE

(71) Applicant: Samsung Display Co., Ltd., Yongin-si, Gyeonggi-do (KR)

(72) Inventors: Bek Hyun Lim, Yongin-si (KR); Ki Nyeng Kang, Yongin-si (KR); Jin Koo Kang, Yongin-si (KR); Sun Kwang Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/666,307

(22) Filed: Aug. 1, 2017

(65) Prior Publication Data

US 2018/0047799 A1 Feb. 15, 2018

(30) Foreign Application Priority Data

Aug. 12, 2016 (KR) .......................... 10-2016-0103042

(51) Int. Cl.
*H01L 27/32* (2006.01)
*G09G 3/3233* (2016.01)
(Continued)

(52) U.S. Cl.
CPC ....... *H01L 27/3248* (2013.01); *G09G 3/3233* (2013.01); *H01L 27/3223* (2013.01); *H01L 27/3262* (2013.01); *H01L 27/3265* (2013.01); *H01L 27/3272* (2013.01); *H01L 27/3276* (2013.01); *G09G 3/3266* (2013.01); *G09G 3/3275* (2013.01); *G09G 2300/0408* (2013.01); *G09G 2300/0426* (2013.01); *G09G 2300/0814* (2013.01); *G09G 2300/0819* (2013.01);
(Continued)

(58) Field of Classification Search
CPC ............. H01L 27/3248; H01L 27/3223; H01L 27/3262; H01L 27/3265; H01L 27/3276; G09G 3/3266; G09G 3/3275
See application file for complete search history.

(56) References Cited

U.S. PATENT DOCUMENTS

2006/0279499 A1* 12/2006 Park ..................... G09G 3/3225
345/92
2011/0248968 A1 10/2011 Suh
(Continued)

FOREIGN PATENT DOCUMENTS

| KR | 10-1142752 A | 5/2012 |
|---|---|---|
| KR | 10-2014-0124217 A | 10/2014 |
| KR | 10-2015-0069433 A | 6/2015 |

*Primary Examiner* — Mark Tornow
(74) *Attorney, Agent, or Firm* — Innovation Counsel LLP

(57) ABSTRACT

A display device includes: a circuit part including at least one first region and at least one second region disposed adjacent to the first region, wherein the second region includes first pixel circuits arranged adjacent to the first region and second pixel circuits spaced apart from the first region; a display element part disposed on the circuit part, wherein a first display elements are connected to the first pixel circuits and overlap with the first region, and a second display elements are connected to the second pixel circuits; and bridge patterns electrically connecting the first and second pixel circuits and the first and second display elements, wherein the length of bridge patterns connecting the first pixel circuits and the first display elements is different from that of bridge patterns connecting the second pixel circuits and the second display elements.

39 Claims, 14 Drawing Sheets

(51) Int. Cl.
*G09G 3/3266* (2016.01)
*G09G 3/3275* (2016.01)
*H01L 27/12* (2006.01)

(52) U.S. Cl.
CPC ..... *G09G 2310/08* (2013.01); *G09G 2330/02* (2013.01); *H01L 27/124* (2013.01)

(56) References Cited

U.S. PATENT DOCUMENTS

| | | | |
|---|---|---|---|
| 2014/0307004 A1 | 10/2014 | Roh | |
| 2015/0170564 A1 | 6/2015 | Kwon | |
| 2016/0349565 A1* | 12/2016 | Kim | ............... G02F 1/13452 |
| 2017/0069692 A1* | 3/2017 | Lee | ............... H01L 27/323 |
| 2017/0221979 A1* | 8/2017 | Chae | ............... H01L 27/3262 |

* cited by examiner

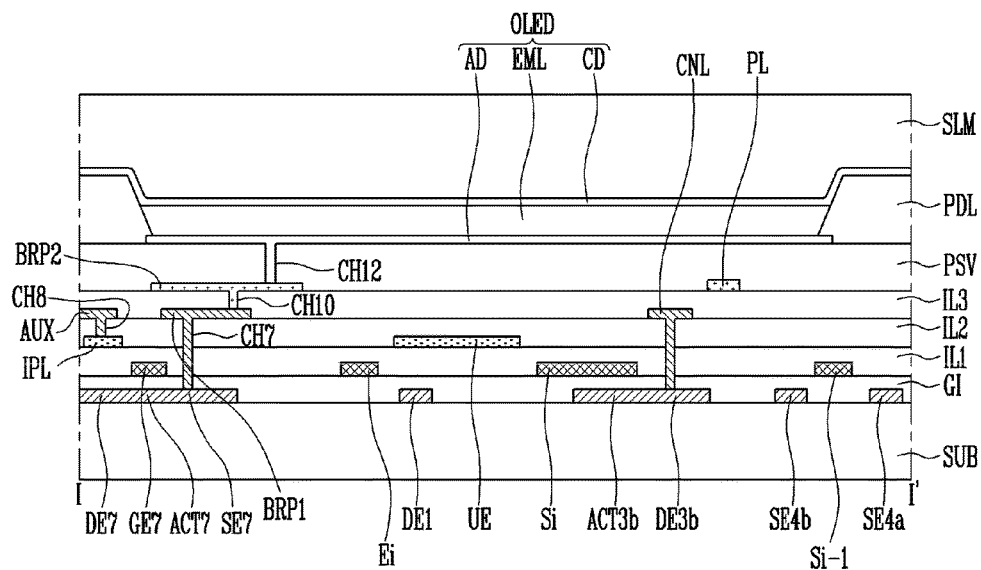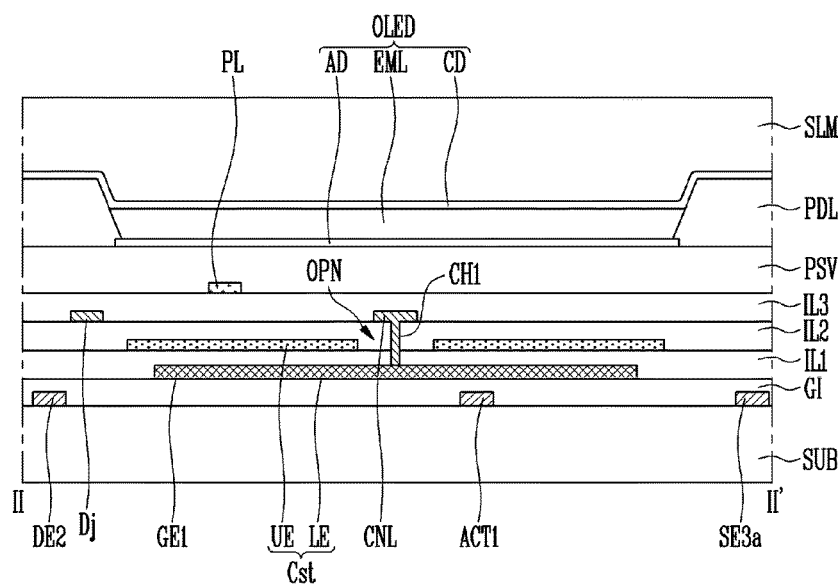

DISPLAY DEVICE

RELATED APPLICATIONS

The present application claims priority to Korean Patent Application No. 10-2016-0103042, filed on Aug. 12, 2016, in the Korean Intellectual Property Office, the entire disclosure of which is incorporated by reference herein

BACKGROUND

1. Field

An aspect of the present disclosure relates to a display device.

2. Description of the Related Art

In general, a display device such as a liquid crystal display, an electrowetting display, an electrophoretic display, or an organic light emitting diode display includes a plurality of pixels. Each pixel includes at least one transistor and a display element connected to the transistor.

The display device includes a scan driver, a light emitting driver, and a data driver, which drive the pixels. Here, since the pixels are not arranged on the drivers, any image cannot be displayed through an area in which the drivers are arranged. That is, the region in which the drivers are arranged may be a non-display region in which any image is not displayed.

The non-display region limits the area of a display region in which an image is displayed in the display device, and accordingly, it is required to decrease the non-display region.

SUMMARY

Embodiments provide a display device in which a display region is increased by extending a region in which display elements are arranged.

According to an aspect of the present disclosure, there is provided a display device including: a circuit part including at least one first region having a driving unit and at least one second region disposed adjacent to the first region, wherein the second region includes first pixel circuits arranged adjacent to the first region and second pixel circuits spaced apart from the first region; a display element part including first display elements and second display elements, the display element part being disposed on the circuit part, wherein the first display elements are electrically connected to the first pixel circuits and overlap with the first region, and the second display elements are electrically connected to the second pixel circuits; and bridge patterns disposed between the circuit part and the display element part, the bridge patterns electrically connecting the first and second pixel circuits to the first and second display elements, wherein the length of bridge patterns connecting the first pixel circuits to the first display elements is different from that of bridge patterns connecting the second pixel circuits to the second display elements.

The length of the bridge patterns connecting the first pixel circuits to the first display elements may be greater than that of the bridge patterns connecting the second pixel circuits to the second display elements.

As the distance between the first pixel circuits and the first display elements increases, the length of the bridge patterns may increase.

The bridge patterns connecting the second pixel circuits to the second display elements may have the same length.

According to an aspect of the present disclosure, there is provided a display device including: a substrate; a circuit part including at least one first region having a driving unit and at least one second region disposed adjacent to the first region, wherein the second region includes first pixel circuits arranged adjacent to the first region and second pixel circuits spaced apart from the first region; a display element part including first display elements and second display elements, the display element part being disposed on the circuit part, wherein the first display elements are electrically connected to the first pixel circuits and overlap with the first region, and the second display elements are electrically connected to the second pixel circuits; and first bridge patterns disposed between the circuit part and the display element part, the bridge patterns electrically connecting the first and second pixel circuits to the first and second display elements, wherein the first and second pixel circuits have at least one transistor, the transistor includes a semiconductor layer disposed on the substrate and a gate electrode disposed on a gate insulating layer formed on the semiconductor layer, and the semiconductor layer includes a source electrode, a drain electrode, and an active pattern disposed between the source electrode and the drain electrode, wherein the circuit part includes: first and second interlayer insulating layers covering the transistor, the first and second interlayer insulating layers being sequentially stacked; connection patterns disposed on the second interlayer insulating layer, the connection patterns being connected to the transistor; and a third interlayer insulating layer disposed over the connection patterns, wherein the first bridge patterns are disposed on the third interlayer insulating layer and connected to the transistor through the connection patterns.

The display device may further include: a first protective layer disposed on the first bridge patterns; and second bridge patterns disposed on the first protective layer, the second bridge patterns being connected to the first bridge patterns.

The display device may further include a coupling shield electrode disposed on the third interlayer insulating layer, the coupling shield electrode being spaced apart from the first bridge patterns, the coupling shield electrode having a constant voltage applied thereto.

The display device may further include a coupling shield electrode disposed on the first protective layer, the coupling shield electrode being spaced apart from the second bridge patterns, the coupling shield electrode having a constant voltage applied thereto.

According to an aspect of the present disclosure, there is provided a display device including: a substrate; a circuit part including at least one first region having a driving unit and at least one second region, the circuit part being disposed on the substrate, wherein the at least one second region includes pixel circuit regions in which pixel circuits are arranged, and the at least one first region is disposed adjacent to the second region; a display element part disposed on the circuit part, the display element part including a plurality of display element regions in which display elements are arranged, the display element part having at least a portion disposed on the first region; and bridge patterns disposed between the circuit part and the display element part, the bridge patterns electrically connecting the pixel circuits to the display elements, wherein the area of at least one of the pixel circuit regions is smaller than that of the display element regions.

The pixel circuit regions may include first pixel circuit regions adjacent to the first region and second pixel circuit regions spaced apart from the first region. The area of the first pixel circuit regions may be smaller than that of the display element regions.

The area of the first pixel circuit regions may be smaller than that of the second pixel circuit regions.

The width or length of the second pixel circuit regions may be greater than that of the first pixel circuit regions.

At least one of the display element regions may not overlap the first pixel circuit regions corresponding thereto in a plan view.

The display element regions arranged on the first region may not overlap the corresponding first pixel circuit regions.

The width or length of the display element regions may be greater than that of the first pixel circuit regions.

The area of the first pixel circuit regions may be equal to that of the second pixel circuit regions.

According to an aspect of the present disclosure, there is provided a display device including: a substrate; a circuit part including at least one first region having a driving unit and at least one second region, the circuit part being disposed on the substrate, wherein the at least one second region includes pixel circuit regions in which pixel circuits are arranged, and the at least one first region is disposed adjacent to the second region; a display element part disposed on the circuit part, the display element part including a plurality of display element regions in which display elements are arranged, the display element part having at least a portion disposed on the first region; and first bridge patterns disposed between the circuit part and the display element part, the bridge patterns electrically connecting the pixel circuits to the display elements, wherein the pixel circuits have at least one transistor, the transistor includes a semiconductor layer disposed on the substrate and a gate electrode disposed on a gate insulating layer formed on the semiconductor layer, and the semiconductor layer includes a source electrode, a drain electrode, and an active pattern disposed between the source electrode and the drain electrode, wherein the circuit part includes: first and second interlayer insulating layers covering the transistor, the first and second interlayer insulating layers being sequentially stacked; connection patterns disposed on the second interlayer insulating layer, the connection patterns being respectively connected to the transistors of the pixel circuits; and a third interlayer insulating layer disposed on the connection patterns, wherein the first bridge patterns are disposed on the third interlayer insulating layer and connected to the connection patterns.

According to an aspect of the present disclosure, there is provided a display device including: a substrate, a circuit part including a first region having a driving unit and a second region, the second region including pixel circuits, a display element part disposed on the circuit part, the display element part having display elements, at least one of the display elements being disposed on the first region, and bridge patterns disposed between the circuit part and the display element part, the bridge patterns electrically connecting the pixel circuits to the display elements, respectively. At least one of the bridge patterns crosses border between adjacent display elements.

A length of a bridge pattern connected to the display element disposed on the first region may be longer than that connected to the display element disposed on the second region.

At least two display elements may be disposed on the first region, and, as a distance between the second region and the display element disposed on the first region increases, the length of the bridge patterns may increase.

The display device may further comprise dummy patterns connected to the bridge patterns, respectively. Lengths of the dummy patterns may in inverse proportion to those of the bridge patterns.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a sectional view taken along line I-I' of FIG. 7.

FIG. 9 is a sectional view taken along line II-II' of FIG. 7.

DETAILED DESCRIPTION

Figure 1:
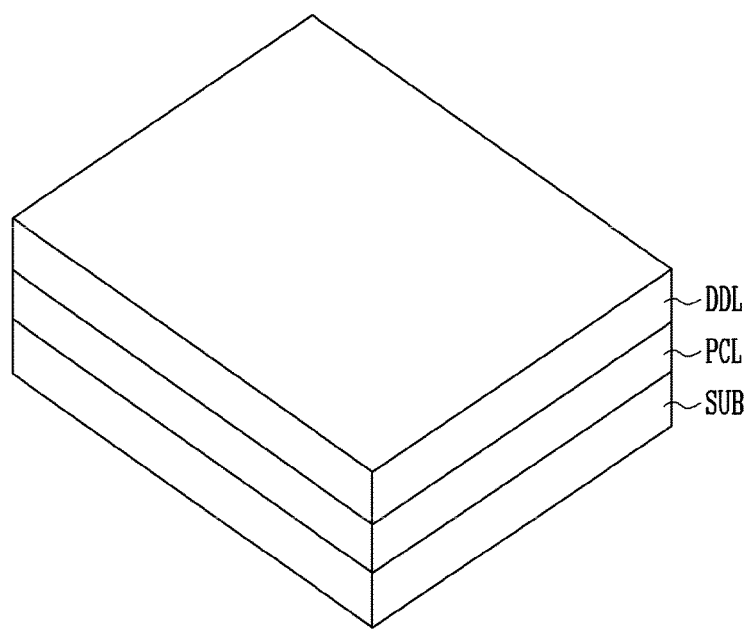
FIG. 1 is a perspective view illustrating a display device according to an embodiment of the present disclosure.

The present disclosure now is described more fully hereinafter with reference to the accompanying drawings, in which exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the present disclosure to those skilled in the art.

Like numbers refer to like elements throughout. In the drawings, the thickness of certain lines, layers, components, elements or features may be exaggerated for clarity. It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

Figure 2:
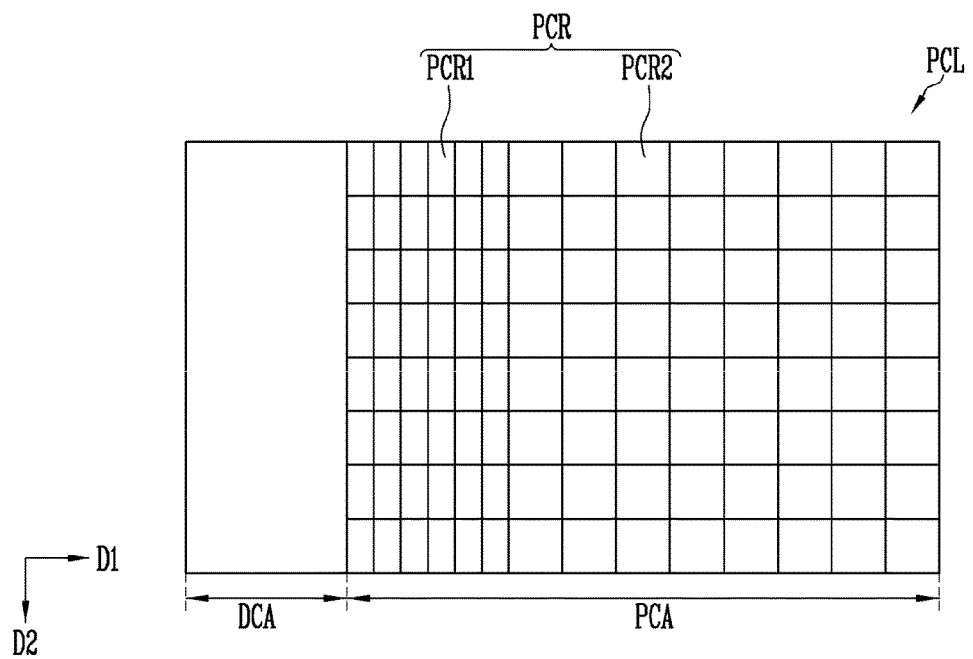
FIG. 2 is a plan view illustrating a circuit part of FIG. 1.
Figure 3:
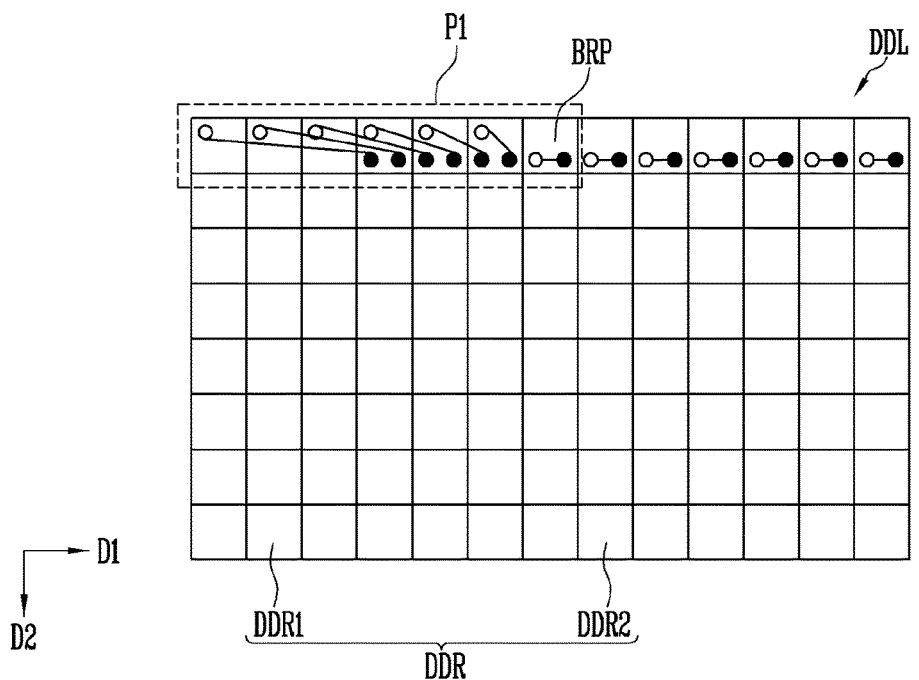
FIG. 3 is a plan view illustrating a display element part of FIG. 1.
Figure 4:
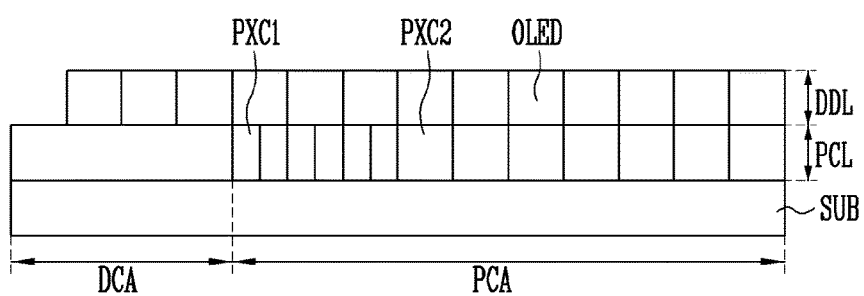
FIG. 4 is a sectional view of the display device shown in FIG. 1.

FIG. 1 is a perspective view illustrating a display device according to an embodiment of the present disclosure. FIG. 2 is a plan view illustrating a circuit part of FIG. 1. FIG. 3 is a plan view illustrating a display element part of FIG. 1. FIG. 4 is a sectional view of the display device shown in FIG. 1. In FIG. 3, only display elements on one pixel row and a connection relationship of the circuit part to the pixel elements have been illustrated for convenience of description.

Referring to FIGS. 1 to 4, the display device may include a substrate SUB, a circuit part PCL disposed on the substrate SUB, and a display element part DDL disposed on the circuit part PCL.

The substrate SUB may have the shape of a closed looped curve. For example, the substrate SUB may be provided in various shapes such as a polygon, a circle, a semicircle, and a semi-ellipse. In this embodiment, for convenience of illustrate, a case where the substrate SUB has a rectangular shape is described as an example.

The circuit part PCL may include a first region DCA and a second region PCA disposed adjacent to the first region DCA.

The second region PCA includes a plurality of pixel circuit regions PCR, and a plurality of pixel circuits PXC1 and PXC2 connected to display elements OLED of the display element part DDL may be arranged in the pixel circuit regions PCR, respectively.

The pixel circuit regions PCR may be arranged in a matrix form including a plurality of rows extending in a first direction D1 and a plurality of columns extending in a second direction D2 intersecting the first direction D1. However, the arrangement of the pixel circuit regions PCR is not particularly limited, and the pixel circuit regions PCR may be arranged in various forms. For example, the rows and the columns may not be orthogonal to each other, but may intersect each other in an oblique direction.

The pixel circuit regions PCR may include first pixel circuit regions PCR1 arranged adjacent to the first region DCA and second pixel circuit regions PCR2 arranged to be spaced apart from the first region DCA. Pixel circuits arranged in the first pixel circuit regions PCR1 may be first pixel circuits PXC1, and pixel circuits arranged in the second pixel circuit regions PCR2 may be second pixel circuits PXC2.

The area of the first pixel circuit regions PCR1 may be smaller than that of the second pixel circuit regions PCR2. For example, if the length of the first pixel circuit regions PCR1 is equal to that of the second pixel circuit regions PCR2, the width of the first pixel circuit regions PCR1 may be shorter than that of the second pixel circuit regions PCR2. Alternatively, if the width of the first pixel circuit regions PCR1 is equal to that of the second pixel circuit regions PCR2, the length of the first pixel circuit regions PCR1 may be shorter than that of the second pixel circuit regions PCR2.

The first region DCA may be disposed adjacent to the second region PCA. For example, the first region DCA may be disposed to contact at least one side of the second region PCA.

The first region DCA may include a driving unit for driving the display elements OLED, and lines connecting the driving unit and the display elements OLED (not shown). The driving unit provides signals to each pixel circuit through the lines, and the pixel circuits may control driving of the display elements OLED.

The driving unit may include a scan driver (not shown) that provides scan signals to the pixel circuits through scan lines (not shown), a light emitting driver (not shown) that provides light emitting control signals to the pixel circuits through light emitting control lines (not shown), and a data driver (not shown) that provides data signals to the pixel circuits through data lines (not shown).

The display element part DDL covers the second region PCA, and may extend to the first region DCA. The display element part DDL may cover at least one portion of the first region DCA. The display element part DDL may include a plurality of display element regions (DDR) in which the respective display elements OLED are arranged. Here, the display element regions DDR may correspond to the pixel circuit regions PCR one by one.

The display element regions DDR may include first display element regions DDR1 arranged on the first region DCA and the first pixel circuit regions PCR1, and second display element regions DDR2 arranged on the second pixel circuit regions PCR2.

The first display element regions DDR1 may be connected to the pixel circuits PXC1 of the first pixel circuit regions PCR1. Here, the first display element regions DDR1 arranged on the first region DCA may be arranged to be spaced apart from the first pixel circuit regions PCR1 corresponding thereto. The area of the first display element regions DDR1 may be equal to that of the second display element regions DDR2.

The area of the display element regions DDR may be greater than that of the first pixel circuit regions PCR1. For example, the length of the display element regions DDR is equal to that of the first pixel circuit regions PCR1 and the width of the display element regions DDR may be greater than that of the first pixel circuit regions PCR1. Alternatively, if the width of the display element regions DDR is equal to that of the first pixel circuit regions PCR1, the length of the display element regions DDR may be greater than that of the first pixel circuit regions PCR1.

The display elements OLED may be connected to the pixel circuits, respectively. Each of the display elements OLED may be any one of a liquid crystal display (LCD) element, an electrophoretic display (EPD) element, an electrowetting display (EWD) element, and an organic light emitting display (OLED) element. Meanwhile, hereinafter, a case where the display elements OLED are organic light emitting display elements is described as an example for convenience of illustration.

Each of the display elements OLED may include an anode electrode, a light emitting layer, and a cathode electrode. The light emitting layer may be disposed between the anode electrode and the cathode electrode. Electrons injected through the anode electrode and holes injected through the cathode electrode are recombined in the light emitting layer to form excitons, and the excitons emit energy while being transited to a ground state. The energy may be emitted in the form of light.

The display element part DDL may extend into the first region DCA of the circuit part PCL. That is, some of the display element regions DDR overlap with the first region DCA, and the display elements OLED provided in the display element regions DDR overlapping with the first region DCA may be arranged on the first region DCA.

The display elements OLED may be electrically connected to the pixel circuits through bridge patterns BRP. Here, the length of bridge patterns BRP connecting the display elements OLED to the pixel circuits arranged in the first pixel circuit regions PCR1 may be longer than that of bridge patterns BRP connecting the display elements OLED to the pixel circuits arranged in the second pixel circuit regions PCR2. In addition, if the distance between the display elements OLED and the second pixel circuit region PCR2 increases, the length of the bridge patterns BRP connecting the display elements OLED to the pixel circuits arranged in the first pixel circuit regions PRC1 may also increase.

Figure 5:
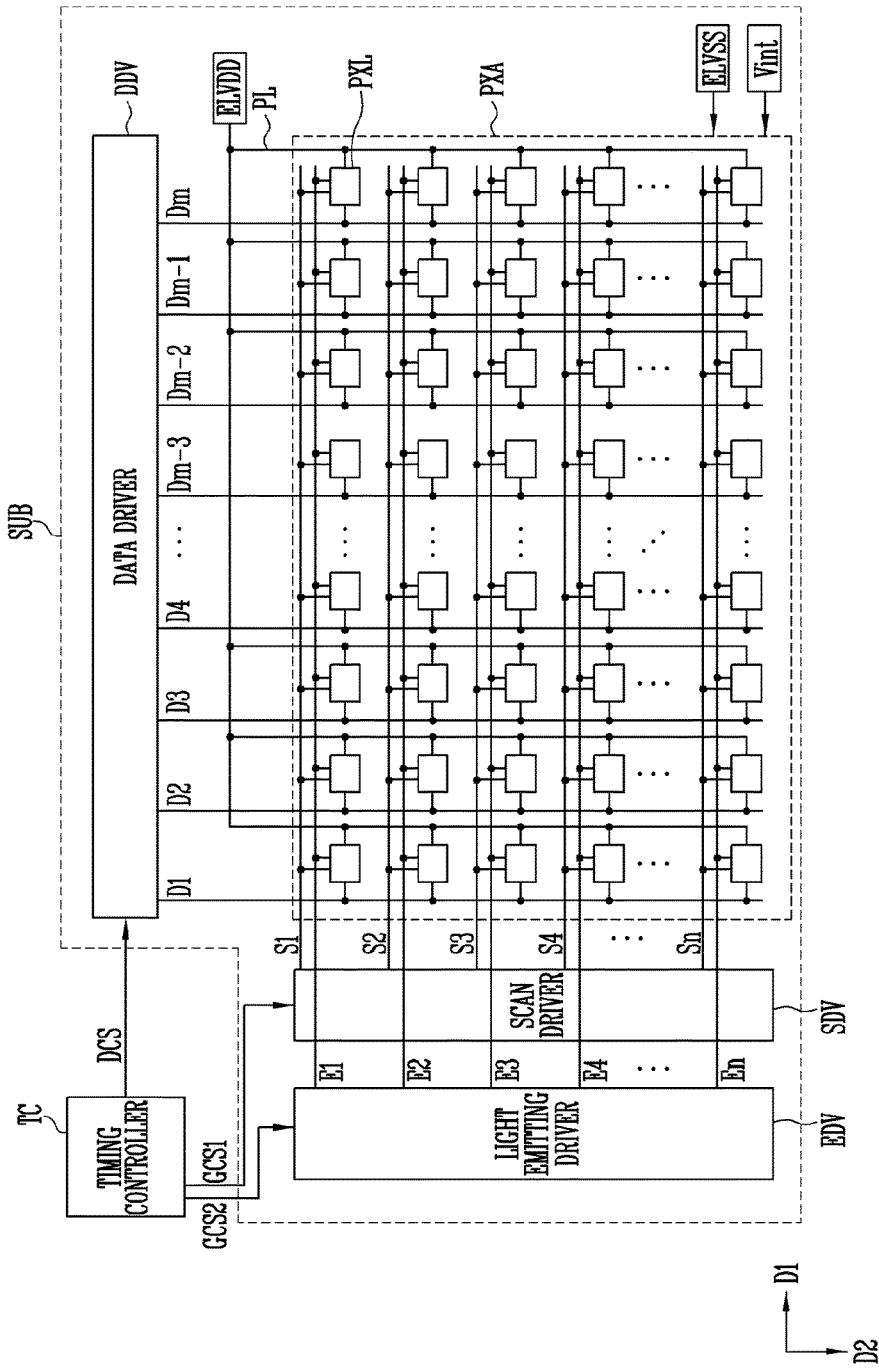
FIG. 5 is a block diagram illustrating an embodiment of pixels and a driving unit in the display device according to the embodiment of the present disclosure.

FIG. 5 is a block diagram illustrating an embodiment of pixels and a driving unit in the display device according to the embodiment of the present disclosure. In FIG. 5, each of the pixels means a combination of the pixel circuit and the display element of FIGS. 1 to 4.

Referring to FIG. 5, the display device according to the embodiment of the present disclosure may include pixels PXL, a driving unit, and a line unit.

The pixel PXL may be provided in plurality. The driving unit may include a scan driver SDV, a light emitting driver EDV, a data driver DDV, and a timing controller TC. In FIG. 5, the positions of the scan driver SDV, the light emitting driver EDV, the data driver DDV, and the timing controller TC are set for convenience of description. When an actual display device is implemented, the scan driver SDV, the light emitting driver EDV, the data driver DDV, and the timing controller TC may be arranged at different positions in the display device.

The line unit provides signals from the drivers to each pixel PXL and may include scan lines, data lines, light emitting control lines, a power line PL, and an initialization power line (not shown). The scan lines may include a plurality of scan lines S1 to Sn, and the light emitting control lines may include a plurality of light emitting control lines E1 to En. The data lines may include a plurality of data lines D1 to Dm. The power line PL and the initialization power line (not shown) may be connected to each pixel PXL.

The pixels PXL may be arranged in a pixel region PXA. The pixels PXL may be connected to the scan lines S1 to Sn, the light emitting control lines E1 to En, and the data lines D1 to Dm. The pixels PXL may receive a data signal supplied from the data lines D1 to Dm when a scan signal is supplied from the scan lines S1 to Sn. Each of the pixels PXL receiving the data signal may control the amount of current flowing to a second power source ELVSS via a display element (not shown) from a first power source ELVDD.

The scan driver SDV may supply the scan signal to the scan lines S1 to Sn in response to a first gate control signal GCS1 from the timing controller TC. For example, the scan driver SDV may sequentially supply the scan signal to the scan lines S1 to Sn. If the scan signal is sequentially supplied to the scan lines S1 to Sn, the pixels PXL may be sequentially selected in units of horizontal lines.

The light emitting driver EDV may supply a light emitting control signal to the light emitting control lines E1 to En in response to a second gate control signal GCS2 from the timing controller TC. For example, the light emitting driver EDV may sequentially supply the light emitting control signal to the light emitting control lines E1 to En.

Here, the light emitting control signal may be set to a wider width than the scan signal. For example, a light emitting control signal supplied to an ith (i is a natural number) light emitting control line Ei may be supplied to overlap with a scan signal supplied to an (i−1)th scan line Si−1 and a scan signal supplied to an ith scan line Si during at least a partial period.

Additionally, the light emitting control signal may be set to a gate-off voltage (e.g., a high voltage) that enables transistors included in the pixels PXL to be turned off. In addition, the scan signal may be set to a gate-on voltage (e.g., a low voltage) that enables the transistors to be turned on.

The data driver DDV may supply the data signal to the data lines D1 to Dm in response to a data control signal DCS from the timing controller TC. The data signal supplied to the data lines D1 to Dm may be supplied to the pixels PXL selected by the scan signal.

The timing controller TC may supply the gate control signals GCS1 and GCS2 generated in response to timing signals supplied from the outside to the scan driver SDV and the light emitting driver EDV, and supply the data control signal DCS to the data driver DDV.

Each of the gate control signals GCS1 and GCS2 may include a start pulse and clock signals. The start pulse may control timing of a first scan signal or a first light emitting control signal. The clock signals may be used to shift the start pulse.

The data control signal DCS may include a source start pulse and clock signals. The source start pulse may control a sampling start time point of data. The clock signals may be used to control a sampling operation.

Figure 6:
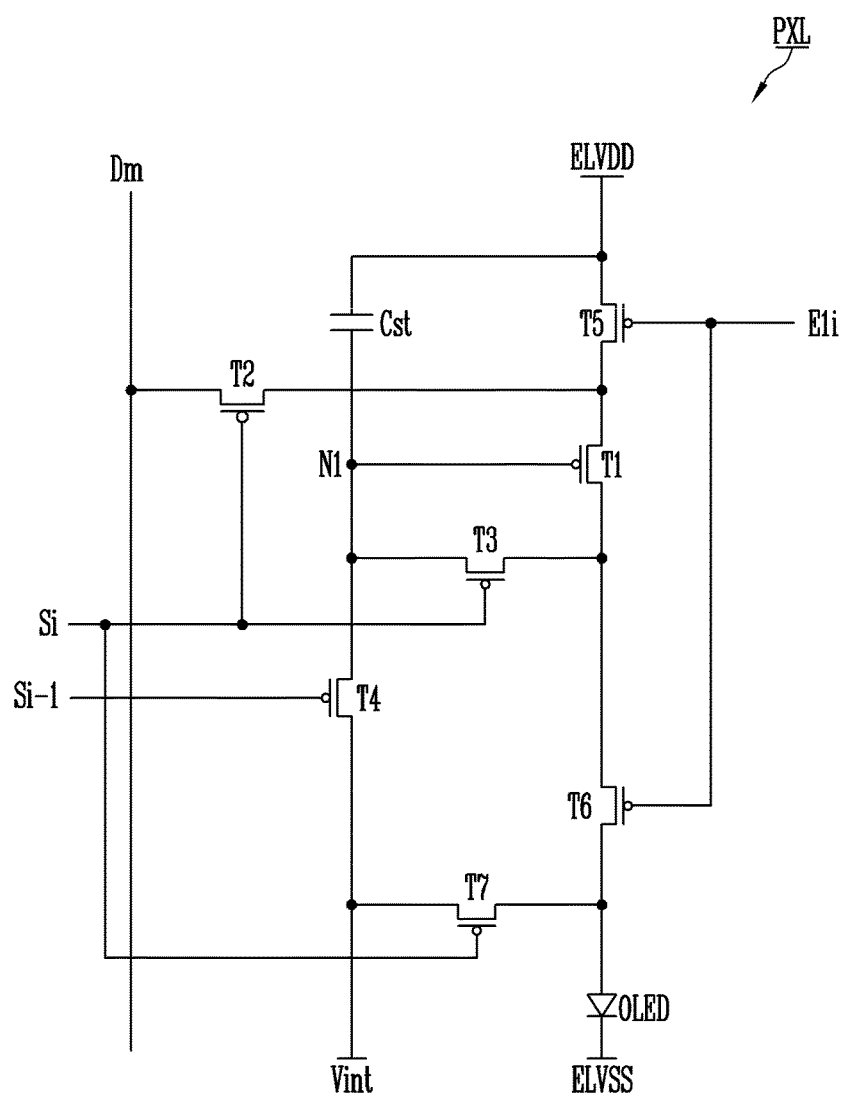
FIG. 6 is a circuit diagram illustrating an embodiment of a pixel PXL shown in FIGS. 1 to 5.

FIG. 6 is a circuit diagram illustrating an embodiment of the pixel PXL shown in FIGS. 1 to 5. In FIG. 6, a pixel connected to a jth data line Dj and an ith scan line Si is illustrated for convenience of description.

Referring to FIG. 6, the pixel PXL according to the embodiment of the present disclosure may include the pixel circuit PXC1 and PXC2 and the display element OLED, which are shown in FIGS. 1 to 4. The pixel circuit PXC1 and PXC2 may include first to seventh transistors T1 to T7 and a storage capacitor Cst.

An anode of the display element OLED may be connected to the first transistor T1 via the sixth transistor T6, and a cathode of the display element OLED may be connected to the second power source ELVSS. The display element OLED may generate light having a predetermined luminance, corresponding to the amount of current supplied from the first transistor T1.

The first power source ELVDD may be set to a higher voltage than the second power source ELVSS such that current can flow in the display element OLED.

The seventh transistor T7 may be connected between an initialization power source Vint and the anode of the display element OLED. A gate electrode of the seventh transistor T7 may be connected to the ith scan line Si. The seventh transistor T7 may be turned on when a scan signal is supplied to the ith scan line Si to supply the voltage of the initialization power source Vint to the anode of the display element OLED. Here, the initialization power source Vint may be set to a lower voltage than a data signal.

The sixth transistor T6 may be connected between the first transistor T1 and the display element OLED. A gate electrode of the sixth transistor T6 may be connected to an ith light emitting control line Ei. The sixth transistor T6 may be turned off when a light emitting control signal is supplied to the ith light emitting control line Ei, and may be turned on in the other cases.

The fifth transistor T5 may be connected between the first power source ELVDD and the first transistor T1. A gate electrode of the fifth transistor T5 is connected to the ith light emitting control line Ei. The fifth transistor T5 may be turned off when the light emitting control signal is supplied to the ith light emitting control line Ei, and may be turned on in the other cases.

A first electrode of the first transistor (driving transistor) T1 may be connected to the first power source ELVDD via the fifth transistor T5, and a second electrode of the first transistor T1 may be connected to the anode of the display element OLED via the sixth transistor T6. A gate electrode of the first transistor T1 may be connected to a first node N1. The first transistor T1 may control the amount of current flowing in the second power source ELVSS via the display element OLED from the first power source ELVDD, corresponding to a voltage of the first node N1.

The third transistor T3 may be connected between the second electrode of the first transistor T1 and the first node N1. A gate electrode of the third transistor T3 may be connected to the ith scan line Si. The third transistor T3 may be turned on when the scan signal is supplied to the ith scan line Si to electrically connect the second electrode of the first transistor T1 to the first node N1. Therefore, the first transistor T1 may be diode-connected when the third transistor T3 is turned on.

The fourth transistor T4 may be connected between the first node N1 and the initialization power source Vint. A gate electrode of the fourth transistor T4 may be connected to an (i−1)th scan line Si−1. The fourth transistor T4 may be turned on when the scan signal is supplied to the (i−1)th scan line Si−1 to supply the voltage of the initialization power source Vint to the first node N1.

The second transistor T2 may be connected between the jth data line Dj and the first electrode of the first transistor T1. A gate electrode of the second transistor T2 may be connected to the ith scan line Si. The second transistor T2 may be turned on when the scan signal is supplied to the ith scan line Si to electrically connect the first electrode of the first transistor T1 to the jth data line Dj.

The storage capacitor Cst may be connected between the first power source ELVDD and the first node N1. The storage capacitor Cst may store a voltage corresponding to the data signal and the threshold voltage of the first transistor T1.

Figure 7:
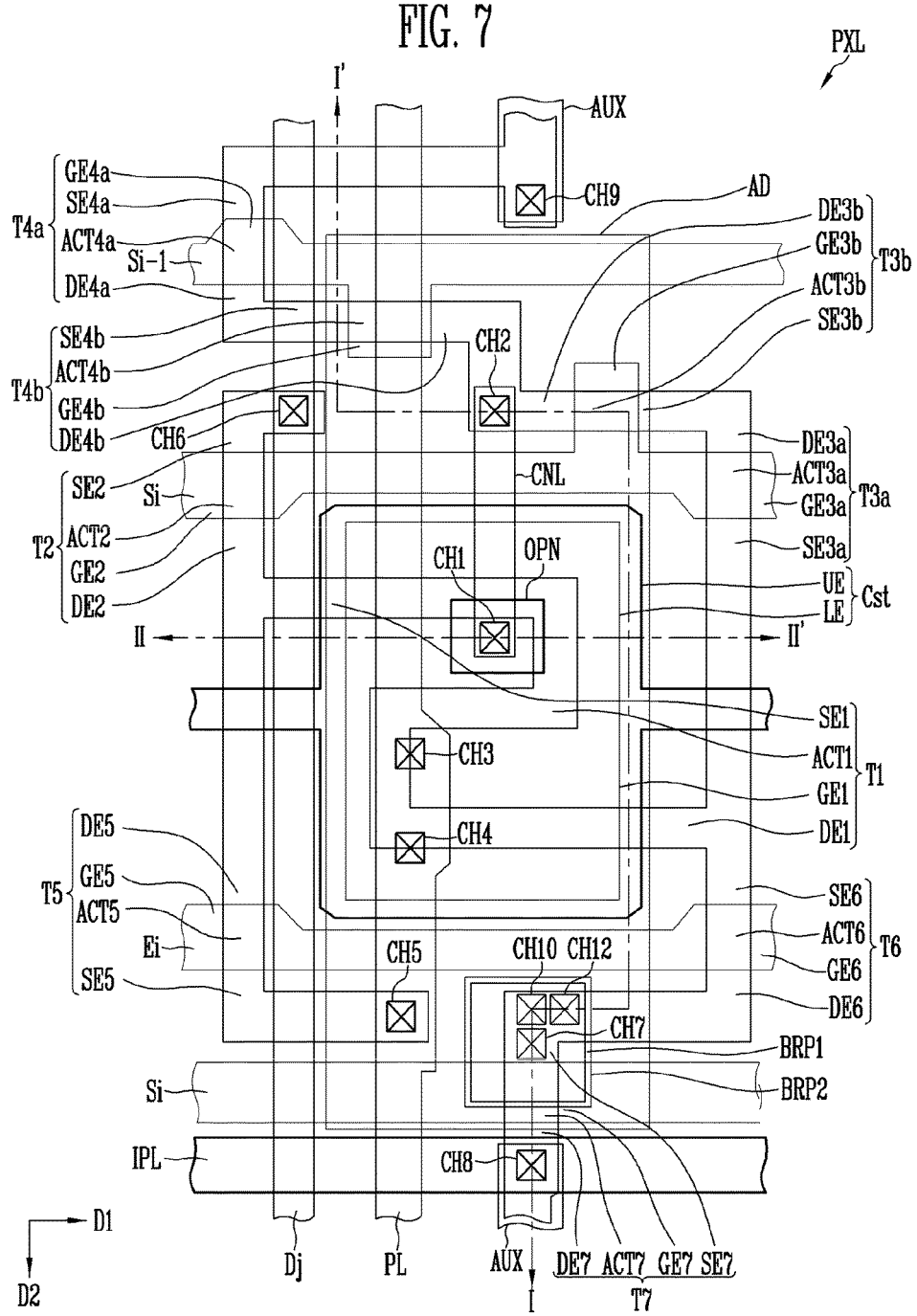
FIG. 7 is a plan view illustrating in detail the pixel shown in FIG. 6.

FIG. 7 is a plan view illustrating in detail the pixel shown in FIG. 6. FIG. 8 is a sectional view taken along line I-I' of FIG. 7. FIG. 9 is a sectional view taken along line II-II' of FIG. 7.

One pixel PXL disposed in a second display element region of an ith pixel row and a jth pixel column, and scan lines Si−1 and Si, a first light emitting control line Ei, a power line PL, and a data line Dj, which are connected to the pixel PXL, have been illustrated in FIGS. 7 to 9. In FIGS. 7 to 9, for convenience of description, a scan line on an (i−1)th pixel row is referred to as an "(i−1)th scan line Si−1," a scan line on the ith pixel row is referred to as an "ith scan line Si," a light emitting control line on the ith pixel row is referred to as a "light emitting control line Ei," a data line on the jth pixel column is referred to as a "data line Dj," and a jth power line is referred to as a "power line PL."

Referring to FIGS. 7 to 9, the display device may include a substrate SUB, a line unit, and pixels PXL.

The substrate SUB may be a flexible substrate. Here, the substrate SUB may be one of a film substrate and a plastic substrate, which include an organic polymer. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and the substrate SUB may include fiber glass reinforced plastic (FRP), etc.

The signal lines provide signals to each of the pixels PXL, and may include scan lines Si−1 and Si, a data line Dj, a light emitting control line Ei, a power line PL, and an initialization power line IPL.

The scan lines Si−1 and Si may extend in the first direction D1. The scan lines Si−1 and Si may include an (i−1)th scan line Si−1 and an ith scan line Si, which are sequentially arranged along the second direction D2. The scan lines Si−1 and Si may receive scan signals applied thereto. For example, the (i−1)th scan line Si−1 may receive an (i−1)th scan signal applied thereto, and the ith scan signal Si may receive an ith scan signal applied thereto. Pixels on an ith row may be initialized by the (i−1)th scan signal applied to the (i−1)th scan line Si−1.

The ith scan line Si may be divided into two lines, and the divided ith scan lines Si may be connected to different transistors.

The light emitting control line Ei may extend in the first direction D1. The light emitting control line Ei is disposed to be spaced apart from the two ith scan lines Si between the ith scan lines Si. The light emitting control line Ei may receive a light emitting control signal applied thereto.

The data line Dj may extend in the second direction D2. The data line Dj may receive a data signal applied thereto.

The power line PL may extend along the second direction D2. The power line PL may be disposed to be spaced apart from the data line Dj. The power line PL may receive the first power source ELVDD applied thereto.

The initialization power line IPL may extend along the first direction D1. The initialization power line IPL may receive the initialization power source Vint applied thereto.

Each of the pixels PXL may include the pixel circuit PXC1 and PXC2 and the display element OLED, which are shown in FIGS. 1 to 4. The pixel circuit may include first to seventh transistors T1 to T7 and a storage capacitor Cst.

The first transistor T1 may include a first gate electrode GE1, a first active pattern ACT1, a first source electrode SE1, a first drain electrode DE1, and a connection line CNL.

The first gate electrode GE1 may be connected to a fourth drain electrode DE4 of the fourth transistor T4 and a third drain electrode DE3 of the third transistor T3. The connection line CNL may connect between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer undoped or doped with an impurity. For example, the first source electrode SE1 and the first drain electrode DE1 may be formed of a semiconductor layer doped with the impurity, and the active pattern ACT1 may be formed of a semiconductor layer undoped with the impurity.

The first active pattern ACT1 has a bar shape extending in a predetermined direction, and may have a shape in which it is bent plural times along the extending direction. The first active pattern ACT1 may overlap with the first gate electrode GE1 in a plan view. As the first active pattern ACT1 between the first source electrode SE1 and the first drain electrode DE1 is long, a channel length of the first transistor T1 can be long. Thus, the driving range of a gate voltage applied to the first transistor T1 is widened. Accordingly, the gray level of light emitted from the display element OLED can be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the ith scan line Si. The second gate electrode GE2 may be protruded from the ith scan line Si or the ith scan line overlapping the second active pattern ACT2 may function as the second gate electrode GE2. In an embodiment of the present disclosure, the second active pattern ACT2, the second source electrode SE2, and the second drain electrode DE2 may be formed of a semiconductor undoped or doped with an impurity. For example, the second source electrode SE2 and the second drain electrode DE2 may be formed of a semiconductor doped with the impurity, and the second active pattern ACT2 may be formed of a semiconductor layer undoped with the impurity. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a dual gate structure so as to prevent a leakage current. That is, the third transistor T3 may include a 3ath transistor T3*a* and a 3bth transistor T3*b*. The 3ath transistor T3*a* may include a 3ath gate electrode GE3*a*, a 3ath active pattern ACT3*a*, a 3ath source electrode SE3*a*, and a 3ath drain electrode DE3*a*. The 3bth transistor T3*b* may include a 3bth gate electrode GE3*b*, a 3bth active pattern ACT3*b*, a 3bth source electrode SE3*b*, and a 3bth drain electrode DE3*b*. Hereinafter, the 3ath gate electrode GE3*a* and the 3bth gate electrode GE3*b* are referred to as a third gate electrode GE3, the 3ath active pattern ACT3*a* and the 3bth active pattern ACT3*b* are referred to as a third active pattern ACT3, the 3ath source electrode SE3*a* and the 3bth source electrode SE3*b* are referred to as the third source electrode SE3, and the 3ath drain electrode DE3*a* and the 3bth drain electrode DE3*b* are referred to as the third drain electrode DE3.

The third gate electrode GE3 may be connected to the ith scan line Si. The third gate electrode GE3 may be protruded from the ith scan line Si or the ith scan line overlapping the third active pattern ACT3 may function as the third gate electrode GE3. For example, the 3ath gate electrode GE3*a* may be provided in a shape protruding from the ith scan line Si, and the 3bth gate electrode GE3*b* may be provided as a portion of the ith scan line Si.

The third active pattern ACT, the third source electrode SE3, and the third drain electrode DE3 may be formed of a semiconductor layer undoped or doped with an impurity. For example, the third source electrode SE3 and the third drain electrode DE3 may be formed of a semiconductor layer doped with the impurity, and the third active pattern ACT3 may be formed of a semiconductor layer undoped with the impurity. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may be provided in a dual gate structure so as to prevent a leakage current. That is, the fourth transistor T4 may include a 4ath transistor T4*a* and a 4bth transistor T4*b*. The 4ath transistor T4*a* may include a 4ath gate electrode GE4*a*, a 4ath active pattern ACT4*a*, a 4ath source electrode SE4*a*, and a 4ath drain electrode DE4*a*, and the 4bth transistor T4*b* may include a 4bth gate electrode GE4*b*, a 4bth active pattern ACT4*b*, a 4bth source electrode SE4*b*, and a 4bth drain electrode DE4*b*. Hereinafter, the 4ath gate electrode GE4*a* and the 4bth gate electrode GE4*b* are referred to as a fourth gate electrode GE4, the 4ath active pattern ACT4*a* and the 4bth active pattern ACT4*b* are referred to as a fourth active pattern ACT4, the 4ath source electrode SE4*a* and the 4bth source electrode SE4*b* are referred to as a fourth source electrode SE4, and the 4ath drain electrode DE4*a* and the 4bth drain electrode DE4*b* are referred to as the fourth drain electrode DE4.

The fourth gate electrode GE4 may be connected to the (i−1)th scan line Si−1. The fourth gate electrode GE4 may be protruded from the (i−1)th scan line Si−1 or the (i−1)th scan line overlapping the fourth active pattern ACT4 may function as the fourth gate electrode GE4. For example, the 4ath gate electrode GE4*a* may be provided as a portion of the (i−1)th scan line Si−1. The 4bth gate electrode GE4*b* may be provided in a shape protruding from the (i−1)th scan line Si−1.

The fourth active pattern ACT4, the fourth source electrode SE4, and the fourth drain electrode DE4 may be formed of a semiconductor layer undoped or doped with an impurity. For example, the fourth source electrode SE4 and the fourth drain electrode DE4 may be formed of a semiconductor layer doped with the impurity, and the fourth active pattern ACT4 may be formed of a semiconductor layer undoped with the impurity. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a pixel PXL on the (i−1)th row and a seventh drain electrode DE7 of a seventh transistor T7 of the pixel PXL on the (i−1)th row. The other end of the fourth source electrode SE4 may be connected to the initialization power line IPL through an eighth contact hole CH8. An auxiliary connection line AUX may be provided between the fourth source electrode SE4 and the seventh drain electrode DE7 of the seventh transistor T7 of the pixel PXL on the (i−1)th row. One end of the auxiliary connection line AUX may be connected to the fourth source electrode SE4 through a ninth contact hole CH9. The other end of the auxiliary connection line AUX may be connected to an initialization power line IPL on the (i−1)th row through an eighth contact hole CH8 of the pixel PXL on the (i−1)th row. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the connection line CNL, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the light emitting control line Ei. The fifth gate electrode GE5 may be protruded from the light emitting control line Ei or the light emitting control line Ei overlapping the fifth active pattern ACT5 may function as the fifth gate electrode GE5. The fifth active pattern ACT, the fifth source electrode SE5, and the fifth drain electrode DE5 may be formed of a semiconductor layer undoped or doped with an impurity. For example, the fifth source electrode SE5 and the fifth drain electrode DE5 may be formed of a semiconductor layer doped with the impurity, and the fifth active pattern ACT5 may be formed of a semiconductor layer undoped with the impurity. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the light emitting control line Ei. The sixth gate electrode SE6 may be protruded from the light emitting control line Ei or the light emitting control line Ei overlapping the sixth active pattern ACT6 may function as the sixth gate electrode GE6. The sixth active pattern ACT6, the sixth source electrode SE6, and the sixth drain electrode DE6 may be formed of a semiconductor layer undoped or doped with an impurity. For example, the sixth source electrode SE6 and the sixth drain electrode DE6 may be formed of a semiconductor layer doped with the impurity, and the sixth active pattern ACT6 may be formed of a semiconductor layer undoped with the impurity. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

The seventh gate electrode GE7 may be connected to the ith scan line Si. The seventh gate electrode GE7 may be protruded from the ith scan line Si or the ith scan line Si overlapping the seventh active pattern ACT7 may function as the seventh gate electrode GE7. The seventh active pattern ACT7, the seventh source electrode SE7, and the seventh drain electrode DE7 may be formed of a semiconductor layer undoped or doped with an impurity. For example, the seventh source electrode SE7 and the seventh drain electrode DE7 may be formed of a semiconductor layer doped with the impurity, and the seventh active layer ACT7 may be formed of a semiconductor layer undoped with the impurity. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL.

Also, the seventh drain electrode DE7 may be connected to a fourth source electrode SE4 of a fourth transistor T4 of a pixel PXL on the ith pixel row. The seventh drain electrode DE7 may be connected to the fourth source electrode SE4 of the fourth transistor T4 of the pixel PXL on the ith row through the auxiliary line AUX, the eighth contact hole CH8, and the ninth contact hole CH9.

The storage capacitor Cst may include a lower electrode LE and an upper electrode UE. The lower electrode LE may be formed as the first gate electrode GE1 of the first transistor T1.

The upper electrode UE overlaps with the first gate electrode GE1, and may cover the lower electrode LE in a plan view. As the overlapping area of the upper electrode UE and the lower electrode LE is widened, the capacitance of the storage capacitor Cst may be increased. The upper electrode UE may extend in the first direction D1. In an embodiment of the present disclosure, a voltage having the same level as the first power source may be applied to the upper electrode UE. The upper electrode UE may have an opening OPN in a region in which the first contact hole CH1 through which the first gate electrode GE1 and the connection line CNL contact each other is formed.

The display element OLED may include a first electrode AD, a second electrode CD, and a light emitting layer EML provided between the first electrode AD and the second electrode CD.

The first electrode AD may be provided in a light emitting region corresponding to each pixel PXL. The first electrode AD may be connected to the seventh source electrode SE7 of the seventh transistor T7 and the sixth drain electrode DE6 of the sixth transistor T6 through a seventh contact hole CH7, a tenth contact hole CH10, and a twelfth contact hole CH12. The bridge pattern BRP may include a first bridge pattern BRP1 provided between the seventh contact hole CH7 and the tenth contact hole CH10 and a second bridge pattern BRP2 provided between the tenth contact hole CH10 and the twelfth contact hole CH12. Here, the first bridge pattern BRP1 may be a conductive pattern for connecting the sixth drain electrode DE6 and the seventh source electrode SE7 to the second bridge pattern BRP2. Thus, the pixel circuit PXC1 and PXC2 can be substantially connected to the display element OLED through the second bridge pattern BRP2.

Hereinafter, a structure of the display device according to the embodiment of the present disclosure will be described along a stacking order with reference to FIGS. 7 to 9.

Active patterns ACT1 to ACT7 (hereinafter, referred to as ACT) may be provided on a substrate SUB. The active pattern may include first to seventh active patterns ACT1 to ACT7. The first to seventh active patterns ACT1 to ACT7 may be formed of a semiconductor material.

A buffer layer (not shown) may be provided between the substrate SUB and the first to seventh active patterns ACT1 to ACT7.

A gate insulating layer GI may be provided on the substrate SUB on which the first to seventh active patterns ACT1 to ACT7 are formed.

An (i−1)th scan line Si−1, an ith scan line Si, a light emitting control line Ei, and first to seventh gate electrodes GE1 to GE7 may be provided on the gate insulating layer GI. The first gate electrode GE1 may be a lower electrode LE of a storage capacitor Cst. The second gate electrode GE2 and the third gate electrode GE3 may be integrally formed with the ith scan line Si. The fourth gate electrode GE4 may be integrally formed with the (i−1)th scan line Si−1. The fifth gate electrode GE5 and the sixth gate electrode GE6 may be integrally formed with the light emitting control line Ei. The seventh gate electrode GE7 may be integrally formed with the ith scan line Si.

A first interlayer insulating layer IL1 may be provided on the substrate SUB on which the (i−1)th scan line Si−1 and the like are formed.

An upper electrode UE of the storage capacitor Cst and an initialization power line IPL may be provided on the first interlayer insulating layer IL1. The upper electrode UE may cover the lower electrode LE. The upper electrode UE and the lower electrode LE may constitute the storage capacitor Cst with the first interlayer insulating layer IL1 interposed therebetween.

A second interlayer insulating layer IL2 may be provided on the substrate SUB on which the upper electrode UE and the initialization power line IPL are disposed.

A data line Dj, a connection line CNL, an auxiliary connection line AUX, and a first bridge pattern BRP1 may be provided on the second interlayer insulating layer IL2.

The data line Dj may be connected to a second source electrode SE2 through a sixth contact hole CH6 passing through the first interlayer insulating layer IL1, the second interlayer insulating layer IL2, and the gate insulating layer GI.

The connection line CNL may be connected to the first gate electrode GE1 through a first contact hole CH1 passing through the first interlayer insulating layer IL1 and the second interlayer insulating layer IL2. Also, the connection line CNL may be connected to a third drain electrode DE3 and a fourth drain electrode DE4 through a second contact hole CH2 passing through the gate insulating layer GI, the first interlayer insulating layer IL1, and the second interlayer insulating layer IL2.

The auxiliary connection line AUX may be connected to the initialization power line IPL through an eighth contact hole CH8 passing through the second interlayer insulating layer IL2. Also, the auxiliary connection line AUX may be connected to a fourth source electrode SE4 and a seventh drain electrode DE7 of a pixel PXL on an (i−1)th row through a ninth contact hole CH9 passing through the gate insulating layer GI, the first interlayer insulating layer IL1, and the second interlayer insulating layer IL2.

The first bridge pattern BRP1 may be a pattern provided as a medium connecting a sixth drain electrode DE6 to a first electrode AD between the sixth drain electrode DE6 and the first electrode AD. The first bridge pattern BRP1 may be connected to the sixth drain electrode DE6 and a seventh source electrode SE7 through a seventh contact hole CH7 passing through the gate insulating layer GI, the first interlayer insulating layer IL1, and the second interlayer insulating layer IL2.

A third insulating layer IL3 may be provided on the substrate SUB on which the jth data line Dj and the like are formed.

A power line PL and a second bridge pattern BRP2 may be provided on the third insulating layer IL3. The second bridge pattern BRP2 may be connected to the first bridge pattern BRP1 through a tenth contact hole CH10.

A protective layer PSV may be provided on the third insulating layer IL3 on which the power line PL and the second bridge pattern BRP2 are provided.

A display element OLED may be provided on the protective layer PSV. The display element OLED may include the first electrode AD, a second electrode CD, and a light emitting layer EML provided between the first electrode AD and the second electrode CD.

The first electrode AD may be provided on the protective layer PSV. The first electrode AD may be connected to the second bridge pattern BRP2 through a twelfth contact hole CH12 passing through the protective layer PSV. Thus, the first electrode AD can be electrically connected to the first bridge pattern BRP1. Since the first bridge pattern BRP1 is connected to the sixth drain electrode DE6 and the seventh source electrode SE7 through the seventh contact hole CH7, the first electrode AD can finally connected electrically to the sixth drain electrode DE6 and the seventh source electrode SE7.

A pixel defining layer PDL defining a light emitting region to correspond to each pixel PXL may be provided on the substrate SUB on which the first electrode AD and the like are formed. The pixel defining layer PDL may be formed along the circumference of the pixel PXL while exposing a top surface of the first electrode AD therethrough.

The light emitting layer EML may be provided in the light emitting region surrounded by the pixel defining layer PDL, and the second electrode CD may be provided on the light emitting layer EML. A sealing layer SLM covering the second electrode CD may be provided on the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the display element OLED is a bottom-emission organic light emitting display element, the first electrode AD may be a transmissive electrode, and the second electrode CD is a reflective electrode. When the display element OLED is a top-emission organic light emitting display element, the first electrode AD may be a reflective electrode, and the second electrode CD may be a transmissive electrode. When the display element OLED is a dual-emission light emitting display element, both of the first electrode AD and the second electrode CD may be transmissive electrodes. In this embodiment, a case where the display element OLED is a top-emission organic light emitting display element, and the first electrode AD is an anode electrode will be described as an example.

The first electrode AD may include a reflective layer (not shown) capable of reflecting light and a transparent conductive layer (not shown) disposed over or under the reflective layer. At least one of the transparent conductive layer and the reflective layer may be connected to a first source electrode SE1.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from the group consisting of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material. For example, the pixel defining layer PDL may include at least one selected from the group consisting of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The light emitting layer EML may be disposed on the exposed surface of the first electrode AD. The light emitting layer EML may have a multi-layered thin film structure at least including a light generation layer (LGL). For example, the light emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron transport layer (EIL) for injecting electrons.

The color of light generated in the LGL may be one of red, green, blue, and white, but the present disclosure is not limited thereto. For example, the color of light generated in the LGL of the light emitting layer EML may also be one of magenta, cyan, and yellow.

The HIL, the HTL, the HBL, the ETL, and the EIL may be common layers which are formed integrally on adjacent light emitting regions.

The second electrode CD may be a semi-transmissive reflective layer. For example, the second electrode CD may be a thin metal layer having a thickness, through which light emitted through the light emitting layer EML can be transmitted. The second electrode CD may transmit a portion of the light emitted from the light emitting layer EML therethrough, and may reflect the rest of the light emitted from the light emitting layer EML.

The second electrode CD may include a material having a lower work function than the transparent conductive layer. For example, the second electrode CD may be include at least one selected from the group consisting of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the light emitting layer EML may not be transmitted through the second electrode CD, and the light reflected from the second electrode CD may be again reflected from the reflective layer. That is, the light emitted from the light emitting layer EML may resonate between the reflective layer and the second electrode CD. The light extraction efficiency of the light emitting device OLED can be improved by the resonance of the light.

The distance between the reflective layer and the second electrode CD may be changed depending on a color of the light emitted from the light emitting layer EML. That is, the distance between the reflective layer and the second electrode CD may be adjusted to correspond to a resonance distance, depending on a color of the light emitted from the light emitting layer EML.

The sealing layer SLM can prevent oxygen and moisture from permeating into the display element OLED. The sealing layer SLM may include a plurality of inorganic layers (not shown) and a plurality of organic layers (not shown). For example, the sealing layer SLM may include a plurality of unit sealing layers including the inorganic layer and the organic layer disposed on the inorganic layer. In addition, the inorganic layer may be disposed at the uppermost portion of the sealing layer SLM. The inorganic layer may include at least one selected from the group consisting of silicon oxide, silicon nitride, silicon oxynitride, aluminum oxide, titanium oxide, zirconium oxide, and tin oxide.

Figure 10:
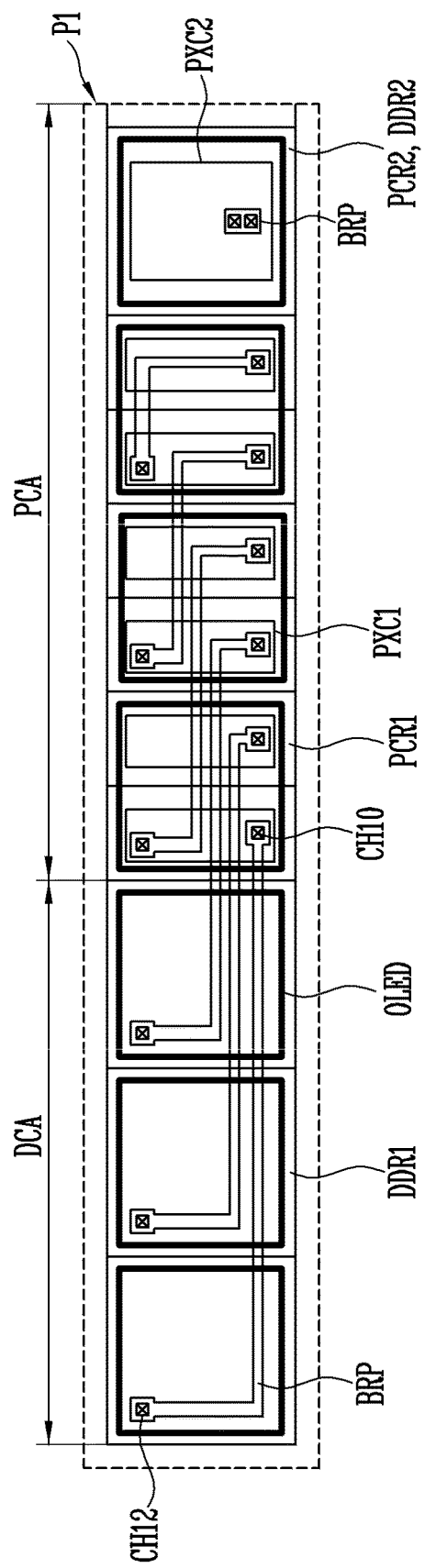
FIG. 10 is an enlarged conceptual view of region P1 of FIG. 3.
Figure 11:
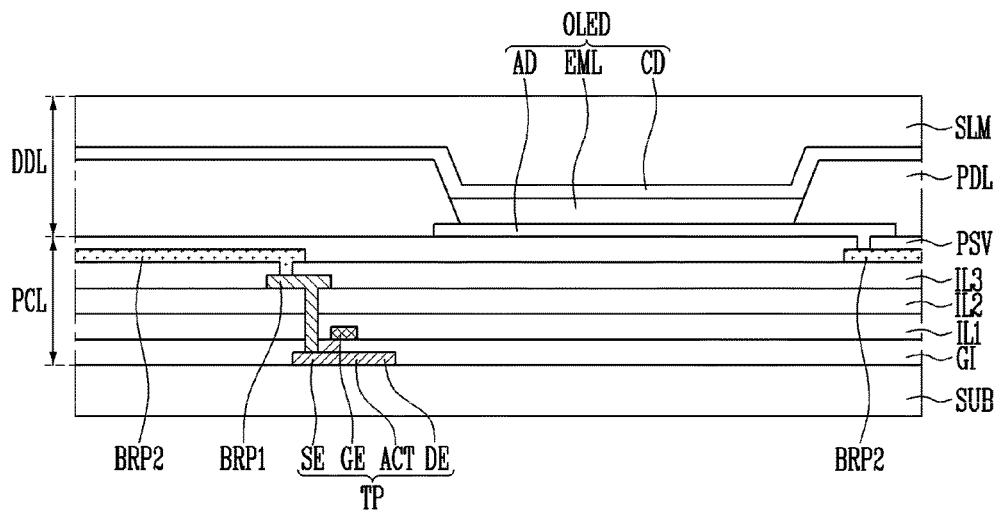
FIG. 11 is a sectional view an arrangement between a pixel circuit and a display element, which are arranged in a first pixel circuit region.
Figure 12:
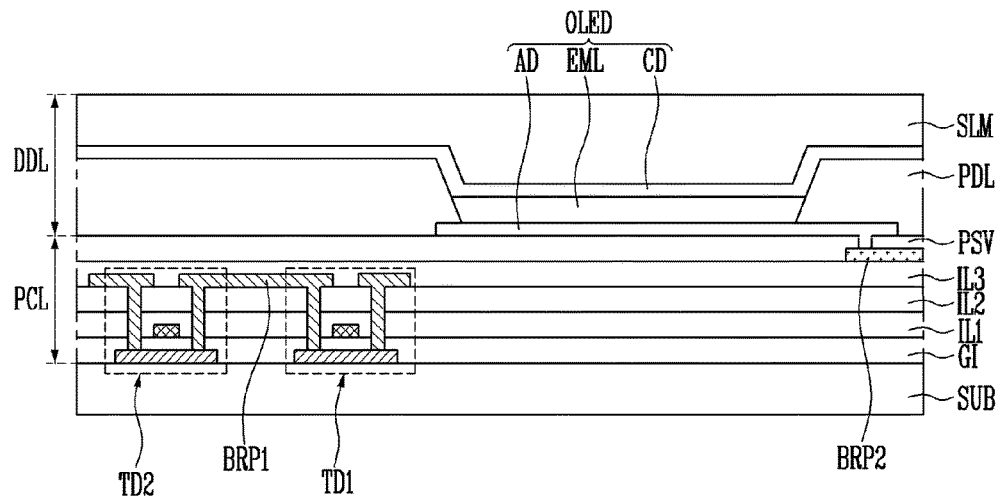
FIG. 12 is a sectional view illustrating a first region and a display element disposed on the first region.
Figure 13:
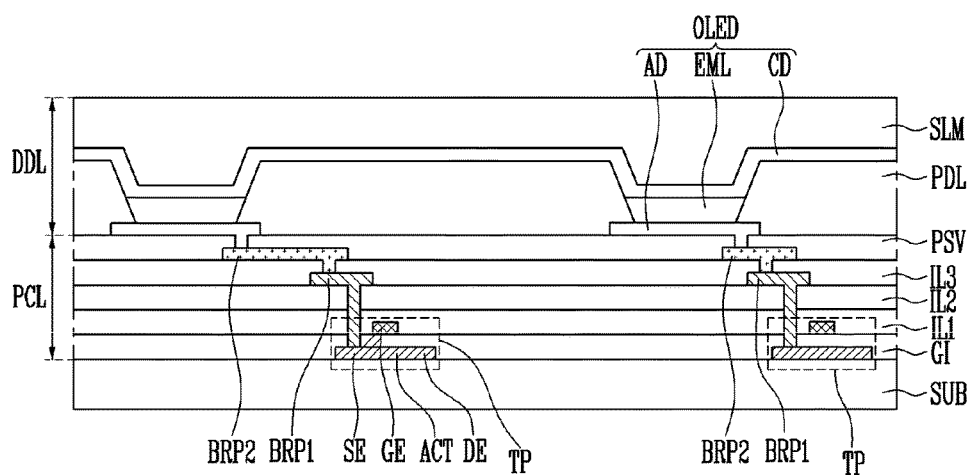
FIG. 13 is a sectional view illustrating a connection between thin film transistors and display elements of pixel circuits arranged in first pixel circuit regions.

FIG. 10 is an enlarged conceptual view of region P1 of FIG. 3. FIG. 11 is a sectional view an arrangement between a pixel circuit and a display element, which are arranged in a first pixel circuit region. FIG. 12 is a sectional view illustrating a first region and a display element disposed on the first region. FIG. 13 is a sectional view illustrating a connection between thin film transistors and display elements of pixel circuits arranged in first pixel circuit regions. In FIGS. 11 to 13, thin film transistors included in a circuit part and display elements included in a display element part have been illustrated for convenience of description.

Referring to FIGS. 10 to 13, the display device may include a substrate SUB, a circuit part PCL provided on the substrate SUB, and a display element part DDL disposed on the circuit part PCL.

The circuit part PCL may include a second region PCA and a first region DCA disposed adjacent to the second region PCA.

The second region PCA includes a plurality of pixel circuit regions PCR1 and PCR2, and pixel circuits PXC1 and PXC2 connected to display elements OLED of the display element part DDL may be disposed in the pixel circuit regions PCR1 and PCR2, respectively. The pixel circuits PXC1 and PXC2 may include at least one transistor TP. The pixel circuit regions PCR1 and PCR2 may include first pixel circuit regions PCR1 adjacent to the first region DCA and second pixel circuit regions PCR2 spaced apart from the first region DCA.

The first region DCA may include a scan driver, a light emitting driver, a data driver, and a timing controller. The scan driver, the light emitting driver, and the data driver may be implemented with at least one transistor TD1 and TD2.

The display element part DDL may include a plurality of display element regions DDR1 and DDR2 in which the respective display elements OLED are arranged. The display elements OLED may be connected to the pixel circuits PXC1 and PXC2 of the second region PCA.

The display element regions DDR1 and DDR2 may include first display element regions DDR1 overlapping with the first region DCA and the first pixel circuit regions PCR1, and second display element regions DDR2 overlapping with the second pixel circuit regions PCR2.

The display elements OLED of the first display element regions DDR1 may be connected to the first pixel circuits PXC1 of the first pixel circuit regions PCR1. The display elements OLED of the second display element regions DDR2 may be connected to the second pixel circuits PXC2 of the second pixel circuit regions PCR2.

The display elements OLED and the pixel circuits PXC1 and PXC2 may be connected through bridge patterns BRP. Here, the bridge patterns BRP may be the second bridge patterns BRP2 shown in FIGS. 7 to 9.

The bridge patterns BRP may be connected to the pixel circuits PXC1 and PXC2 through a contact hole CH10. The contact hole CH10 connecting the bridge patterns BRP to the pixel circuits PXC1 and PXC2 therethrough may be the tenth contact hole CH10 shown in FIGS. 7 to 9. In addition, the bridge patterns BRP may be connected to the display elements OLED through a contact hole CH12. The contact hole CH12 connecting the bridge patterns BPR to the display elements OLED therethrough may be the twelfth contact hole CH12 shown in FIGS. 7 to 9.

The lengths of bridge patterns BRP connecting the second pixel circuits PXC2 to the display elements OLED of the second display element regions DDR2 may all be the same.

The lengths of the bridge patterns BRP connecting the second pixel circuits PXC2 to the display elements OLED of the second display element regions DDR2 may be shorter than those of bridge patterns BRP connecting the first pixel circuits PXC1 to the display elements OLED of the first display element regions DDR1.

The lengths of the bridge patterns BRP connecting the first pixel circuits PXC1 to the display elements OLED of the first display element regions DDR1 may be different from one another. For example, the length of a bridge pattern BRP connecting the display element OLED to a first pixel circuit PXC1 adjacent to the first region DCA among first pixel circuits PXC1 may be longer than that of a bridge pattern BRP connecting the display element OLED to the first pixel circuit PXC1 far off the first region DCA.

In addition, as the distance between the display element OLED of the first display element region DDR1 and the first pixel circuit PXC1, which are connected by the bridge pattern BRP, increases, the length of the bridge pattern BRP may increase.

Hereinafter, a structure of the display device according to the embodiment of the present disclosure will be described along a stacking order with reference to FIGS. 11 to 13.

The display device may include a substrate SUB, a circuit part PCL disposed on the substrate SUB, and a display element part DDL disposed on the circuit part PCL.

The circuit part PCL may include a second region PCA and a first region DCA disposed adjacent to the second region PCA. Each of the second region PCA and the first region DCA may include at least one transistor TP, TD1, and TD2. The transistor TP of the second region PCA may be the seventh transistor T7 shown in FIGS. 7 to 9. The transistor TP of the second region PCA and the transistors TD1 and TD2 of the first region DCA may have the same structure.

Hereinafter, for convenience of illustration, the stacking structure of the circuit part PCL is described based on the transistor TP of the second region PCA.

The transistor TP may include a source electrode SE, a drain electrode DE, and a gate electrode GE.

The source electrode SE and the drain electrode DE may be integrally provided with an active pattern ACT. For example, the source electrode SE and the drain electrode DE may be formed of a semiconductor layer doped with an impurity, and the active pattern ACT may be formed of a semiconductor layer undoped with the impurity. Here, a channel of the transistor TP may be form in the active pattern ACT.

A gate insulating layer GI may be disposed over the source electrode SE, the active pattern ACT, and the drain electrode DE, and the gate electrode GE may be disposed on the gate insulating layer GI.

A first interlayer insulating layer IL1 and a second interlayer insulating layer IL2, which are sequentially stacked, may be disposed on the gate insulating layer GI on which the gate electrode GE is disposed. That is, the first interlayer insulating layer IL1 and the second interlayer insulating layer IL2 may cover the transistor TP.

A first bridge pattern BRP1 connected to the source electrode SE through a contact hole may be disposed on the second interlayer insulating layer IL2. The first bridge pattern BRP1 may include the same material as the data line Dj, the connection line CNL, and the auxiliary connection line AUX, which are shown in FIGS. 7 to 9. In addition, the contact hole may be the seventh contact hole CH7 shown in FIGS. 7 to 9.

A third interlayer insulating layer IL3 may be disposed on the second interlayer insulating layer IL2 on which the first bridge pattern BRP1 is disposed.

A second bridge pattern BRP2 connected to the first bridge pattern BRP1 through a contact hole may be disposed on the third interlayer insulating layer IL3. The contact hole may be the tenth contact hole CH10 shown in FIGS. 7 to 9. In addition, the second bridge pattern BRP2 may be the bridge pattern BRP shown in FIG. 10, and the first bridge pattern BRP1 may be a connection pattern for connecting the transistor TP to the second bridge pattern BRP2.

As shown in FIG. 13, the lengths of second bridge patterns BRP2 connecting the first pixel circuits PXC1 to the display elements OLED of the first display element regions DDR1 may be different from each other. For example, the length of a second bridge pattern BRP2 connecting the display element OLED to a first pixel circuit PXC1 adjacent to the first region DCA may be longer than that of a second bridge pattern BRP2 connecting the display element OLED to the first pixel circuit PXC1 far off the first region DCA.

A protective layer PSV may be disposed on the third interlayer insulating layer IL3 on which the second bridge pattern BRP2 is disposed, and a display element OLED may be disposed on the protective layer PSV.

The display element OLED may include a first electrode AD disposed on the protective layer PSV, a light emitting layer EML disposed on the first electrode AD, and a second electrode CD disposed on the light emitting layer EML.

The first electrode AD is disposed on the protective layer PSV, and may be connected to the second bridge pattern BRP2 through a contact hole passing through the protective layer PSV. The contact hole may be the twelfth contact hole CH12 shown in FIGS. 7 to 9. Thus, the first electrode AD can be electrically connected to the source electrode SE through the first bridge pattern BRP1 and the second bridge pattern BRP2. That is, the display element OLED can be electrically connected to the source electrode SE through the first bridge pattern BRP1 and the second bridge pattern BRP2. Therefore, the bridge pattern BRP may include the first bridge pattern BRP1 and the second bridge pattern BRP2.

Hereinafter, display devices according to other embodiments of the present disclosure will be described with reference to FIGS. 14 to 24. In FIGS. 14 to 24, components identical to those shown in FIGS. 1 to 13 are designated by like reference numerals, and will be briefly described. In addition, differences from FIGS. 1 to 14 will be mainly described to avoid redundancy.

Figure 14:
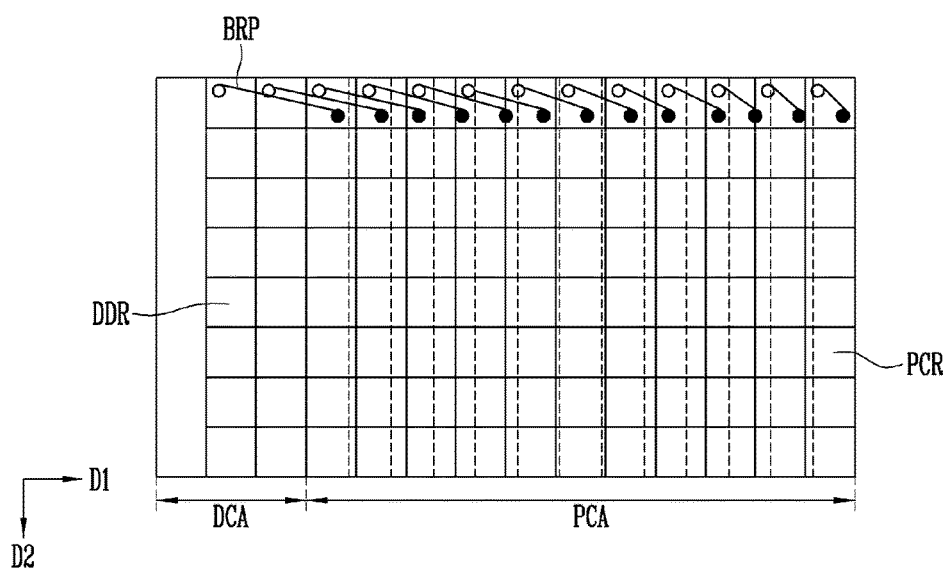
FIG. 14 is a plan view illustrating a display device according to another embodiment of the present disclosure.
Figure 15:
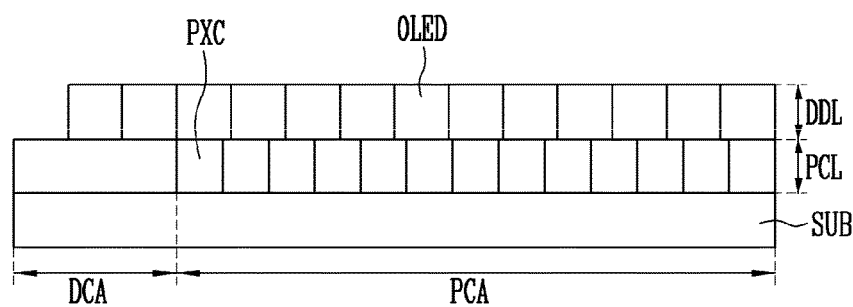
FIG. 15 is a sectional view of the display device shown in FIG. 14.

FIG. 14 is a plan view illustrating a display device according to another embodiment of the present disclosure. FIG. 15 is a sectional view of the display device shown in FIG. 14.

Referring to FIGS. 14 and 15, the display device may include a substrate SUB, a circuit part PCL disposed on the substrate SUB, and a display element part DDL disposed on the circuit part PCL.

The circuit part PCL may include a first region DCA and a second region PCA disposed adjacent to the first region DCA.

The second region PCA may include a plurality of pixel circuit regions PCR, and a plurality of pixel circuits PXC connected to display elements OLED of the display element part DDL may be disposed in the pixel circuit regions PCR, respectively. Here, the area of one of adjacent pixel circuit regions PCR may be equal to that of the other of the adjacent pixel circuit regions PCR.

The display element part DDL may include a plurality of display element regions DDR in which the respective display elements OLED are disposed. The display elements OLED may be connected to the pixel circuits PXC, respectively.

The display element part DDL may extend to the first region DCA of the circuit part PCL. That is, some of the display element regions DDR may overlap with the first region DCA, and the display elements OLED provided in the display element regions DDR overlapping with the first region DCA may be disposed on the first region DCA. The area of each display element region DDR may be equal to that of an adjacent display element region DDR.

In addition, the area of each display element region DDR may be greater than that of each pixel circuit region PCR. For example, if the length the display element regions DDR is equal to that of the pixel circuit regions PCR, the width of the display element regions DDR may be longer than that of the pixel circuit regions PCR. Alternatively, if the width the display element regions DDR is equal to that of the pixel circuit regions PCR, the length of the display element regions DDR may be longer than that of the pixel circuit regions PCR.

The display elements OLED and the pixel circuits PXC may be connected through bridge patterns BRP.

The length of a bridge pattern BRP connecting a display element OLED and a pixel circuit PXC, which are disposed at one end of the display device in the row direction, may be different from that of a bridge pattern BRP connecting a display element OLED and a pixel circuit PXC, which are disposed at the other end of the display device in the row direction. In addition, the length of a bridge pattern BRP adjacent to the one end among adjacent bridge patterns BRP may be longer or shorter than that of a bridge pattern BRP adjacent to the other end among the adjacent bridge patterns BRP.

If the one end is a portion of the second region PCA, which is most distant from the boundary between the second region PCA and the first region DCA, the length of a bridge pattern BRP adjacent to the one end among adjacent bridge patterns BRP may be shorter than that of a bridge pattern BRP adjacent to the other end among the adjacent bridge patterns BRP.

Figure 16:
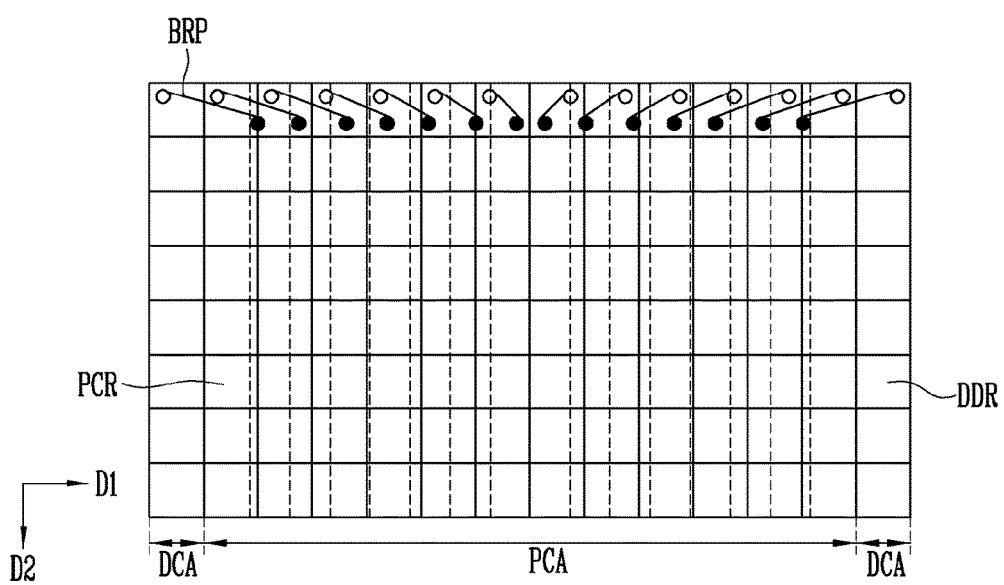
FIGS. 16 and 17 are plan views illustrating display devices according to still other embodiments of the present disclosure.
Figure 17:
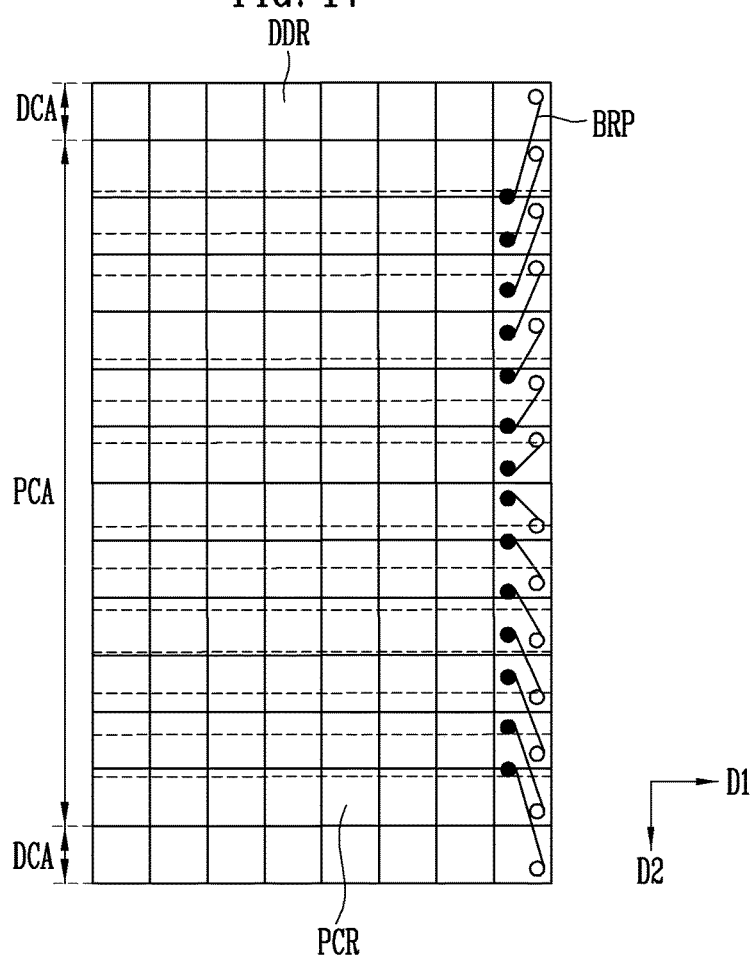
Figure 18:
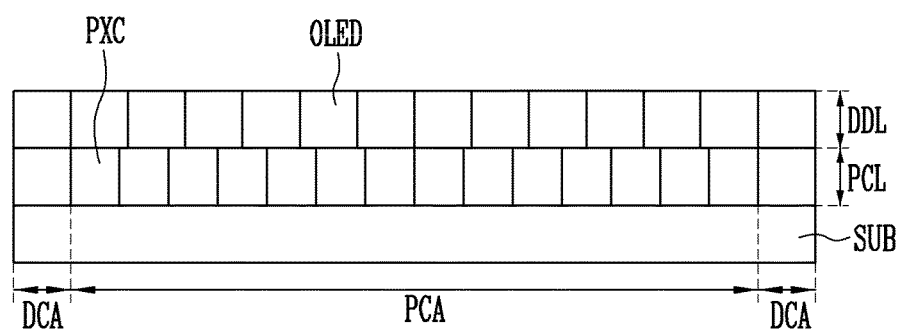
FIG. 18 is a sectional view of the display device shown in FIG. 16 in a first direction or a sectional view of the display device shown in FIG. 17 in a second direction.

FIGS. 16 and 17 are plan views illustrating display devices according to still other embodiments of the present disclosure. FIG. 18 is a sectional view of the display device shown in FIG. 16 in a first direction D1 or a sectional view of the display device shown in FIG. 17 in a second direction D2.

Referring to FIGS. 16 to 18, the display device may include a substrate SUB, a circuit part PCL disposed on the substrate SUB, and a display element part DDL disposed on the circuit part PCL.

The circuit part PCL may include a first region DCA and at least one second region PCA disposed adjacent to the first region DCA. For example, the circuit part PCL may include two first regions DCA, and the first regions DCA may be respectively disposed at both sides of the second region PCA in the row direction or column direction.

The second region PCA may include a plurality of pixel circuit regions PCR, and a plurality of pixel circuits PXC connected to display elements OLED of the display element part DDL may be disposed in the pixel circuit regions PCR, respectively. Here, the area of each pixel circuit region PCR may be equal to that of an adjacent pixel circuit region PCR.

The display element part DDL may include a plurality of display element regions DDR in which the respective display elements OLED are disposed. The display elements OLED may be connected to the pixel circuit PXC, respectively.

The display element part DDL may extend to the first region DCA of the circuit part PCL. That is, some of the display element regions DDR may overlap with the first region DCA, and the display elements OLED provided in the display element regions DDR overlapping with the first region DCA may be disposed on the first region DCA. The area of each display element region DDR may be equal to that of an adjacent display element region DDR. In addition, the area of each display element region DDR may be greater than that of each pixel circuit region PCR.

The display elements OLED and the pixel circuits PXC may be connected through bridge patterns BRP.

As shown in FIG. 16, the length of a bridge pattern BRP connecting a display element OLED and a pixel circuit PXC, which are disposed at one end of the display device in the row direction, may be different from that of a bridge pattern BRP connecting a display element OLED and a pixel circuit PXC, which are disposed at a central portion between the first regions DCA. For example, the length of a bridge pattern BRP adjacent to the one end among adjacent bridge patterns BRP may be longer than that of a bridge pattern BRP adjacent to the central portion.

Alternatively, the length of a bridge pattern BRP connecting a display element OLED and a pixel circuit PXC, which are disposed at one end of the display device in the column direction, may be different from that of a bridge pattern BRP connecting a display element OLED and a pixel circuit PXC, which are disposed at a central portion between the first regions DCA.

Figure 19:
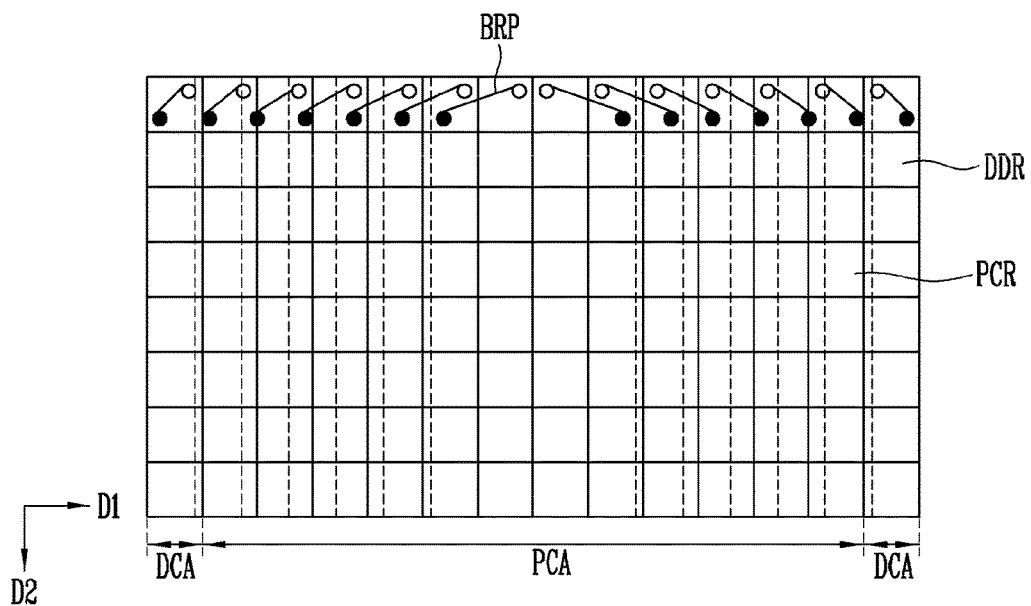
FIG. 19 is a plan view illustrating a display device according to still another embodiment of the present disclosure.
Figure 20:
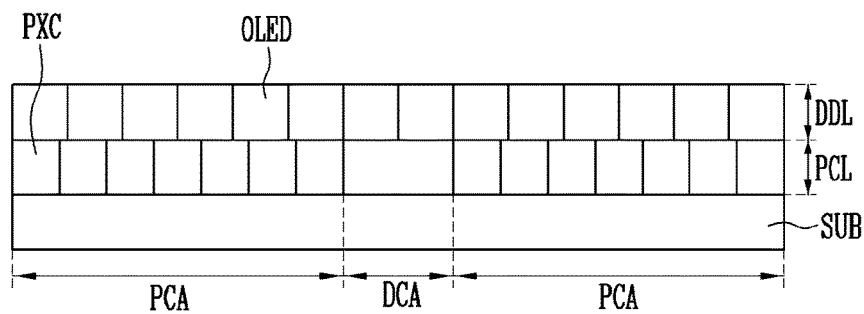
FIG. 20 is a sectional view of the display device shown in FIG. 19.

FIG. 19 is a plan view illustrating a display device according to still another embodiment of the present disclosure. FIG. 20 is a sectional view of the display device shown in FIG. 19.

Referring to FIGS. 19 and 20, the display device may include a substrate SUB, a circuit part PCL disposed on the substrate SUB, and a display element part DDL disposed on the circuit part PCL.

The circuit part PCL may include a first region DCA and at least one second region PCA disposed adjacent to the first region DCA. For example, the circuit part PCL may include two second regions PCA, and the second regions PCA may be disposed at both sides of the first region DCA, respectively. That is, the first region DCA may be disposed between the second regions PCA.

The second regions PCA may include a plurality of pixel circuit regions PCR, and a plurality of pixel circuits PXC connected to display elements OLED of the display element part DDL may be disposed in the pixel circuit regions PCR, respectively.

The display element part DDL may include a plurality of display element regions DDR in which the respective display elements OLED are disposed. The display elements OLED may be connected to the pixel circuit PXC, respectively.

The display element part DDL may cover the second regions PCA and the first region DCA. That is, the display elements OLED provided in the display element regions DDR overlapping with the first region DCA may be disposed on the first region DCA.

The display elements OLED and the pixel circuits PXC may be connected through bridge patterns BRP. The length of a bridge pattern BRP connecting a display element OLED and a pixel circuit PXC, which are disposed at one end of the display device in the row direction, may be different from that of a bridge pattern BRP connecting a display element OLED and a pixel circuit PXC, which are disposed at a central portion between the second regions PCA. For example, the length of a bridge pattern BRP adjacent to the one end among adjacent bridge patterns BRP may be shorter than that of a bridge pattern adjacent to the central portion among the adjacent bridge patterns BRP.

Figure 21:
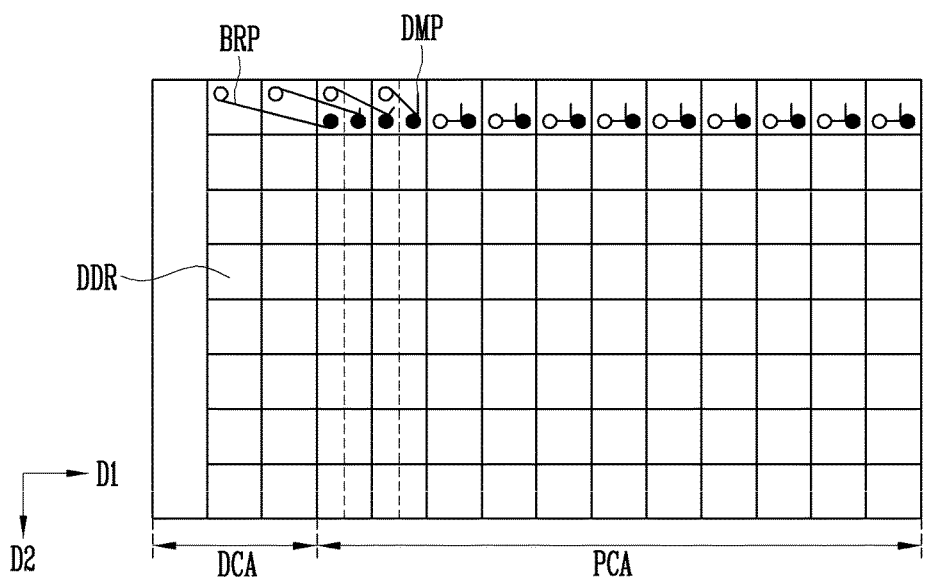
FIG. 21 is a plan view illustrating a display device according to still another embodiment of the present disclosure.

FIG. 21 is a plan view illustrating a display device according to still another embodiment of the present disclosure.

Referring to FIG. 21, the display device may include a substrate (not shown), a circuit part (not shown) disposed on the substrate, and a display element part (not shown) disposed on the circuit part. The circuit part may include a first region DCA and a second region PCA disposed adjacent to the first region DCA. The second region PCA may include a plurality of pixel circuit regions (not shown), and pixel circuits (not shown) connected to display elements (not shown) of the display element part may be disposed in the pixel circuit regions, respectively. The display element part may include a plurality of display element regions DDR in which the respective display elements are disposed. The display elements may be connected to the pixel circuits, respectively.

The display element part may extend to the first region DCA of the circuit part. That is, some of the display element regions DDR may overlap with the first region DCA, and the display elements provided in the display element regions DDR overlapping with the first region DCA may be disposed on the first region DCA.

The display elements and the pixel circuits may be connected through bridge patterns BRP.

The length of a bridge pattern BRP connecting a display element and a pixel circuit, which are disposed at one end of the display device in the row direction, may be different from that of a bridge pattern BRP connecting a display element and a pixel circuit, which are disposed at the other end of the display device in the row direction. In addition, the length of a bridge pattern BRP adjacent to the one end among adjacent bridge patterns BRP may be longer or shorter than that of a bridge pattern BRP adjacent to the other end among the adjacent bridge patterns BRP.

If the one end is a portion of the second region PCA, which is most distant from the boundary between the second region PCA and the first region DCA, the length of a bridge pattern BRP adjacent to the one end among adjacent bridge patterns BRP may be shorter than that of a bridge pattern BRP adjacent to the other end among the adjacent bridge patterns BRP.

In an embodiment of the present disclosure, the display device may further include dummy patterns DMP disposed on the same layer as the bridge patterns BRP, in addition to the bridge patterns BRP connecting the display elements and the pixel circuits. The dummy patterns DMP may be connected to the bridge patterns BRP, respectively. The dummy patterns DMP can compensate for differences in loads generated due to differences of the lengths of the bridge patterns BRP.

The lengths of the dummy patterns DMP may be different from one another. For example, as the length of the bridge pattern BRP increases, the length of the dummy pattern DMP may decrease. The length of the dummy pattern DMP may be in inverse proportion to that of the bridge pattern BRP.

The first power source ELVDD shown in FIG. 5 may be supplied to the dummy pattern DMP. The dummy pattern DMP may form a capacitor with a second electrode of the display element. The dummy pattern may add the capacitance of the capacitor to the bridge pattern BRP. Thus, loads corresponding to differences in length between the bridge patterns BRP can be compensated, and the loads of the bridge patterns BRP can entirely become equal or similar to one another, regardless of the lengths of the bridge patterns BRP.

Signals applied to the display elements through the bridge patterns BRP may be delayed according to the loads of the bridge patterns BRP. As shown in FIG. 21, if the lengths of the bridge patterns BRP are different from one another, the loads of the bridge patterns BRP may be different from one another. If the loads of the bridge patterns BRP are different from one another, RC delays of the bridge patterns BRP may be different from one another.

Meanwhile, in the embodiment of the present disclosure, the loads of the bridge patterns BRP can become equal or similar to one another through the dummy patterns DMP. Thus, the RC delays of the bridge patterns BRP can be equal or similar to one another.

Figure 22:
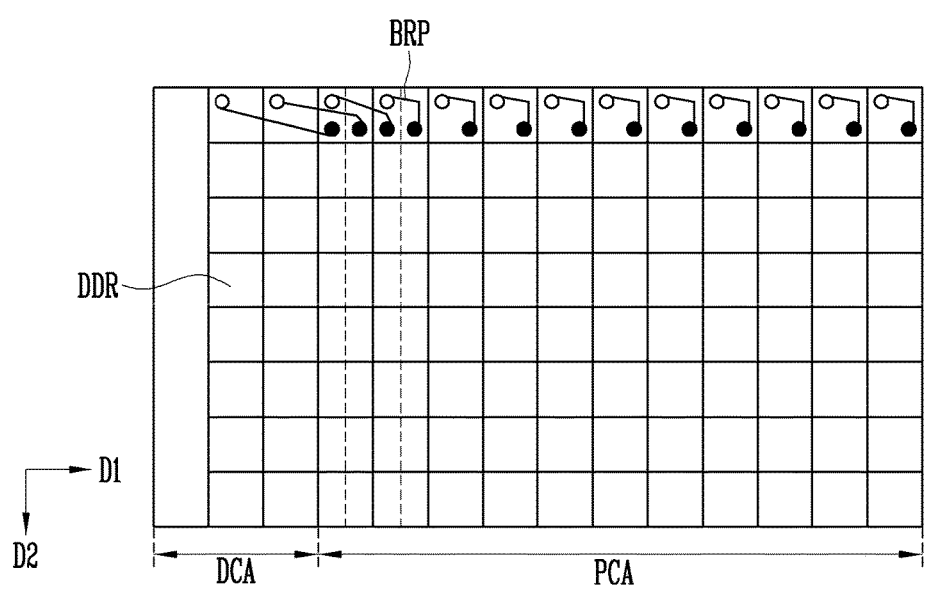
FIG. 22 is a plan view illustrating a display device according to still another embodiment of the present disclosure.

FIG. 22 is a plan view illustrating a display device according to still another embodiment of the present disclosure.

Referring to FIG. 22, the display device may include a substrate (not shown), a circuit part (not shown) disposed on the substrate, and a display element part (not shown) disposed on the circuit part. The circuit part may include a first region DCA second region PCA and a second region PCA disposed adjacent to the first region DCA. The second region PCA may include a plurality of pixel circuit regions (not shown), and pixel circuits (not shown) connected to display elements (not shown) of the display element part may be disposed in the pixel circuit regions, respectively. The display element part may include a plurality of display element regions DDR in which the respective display elements are disposed. The display elements may be connected to the pixel circuits, respectively.

The display element part may extend to the first region DCA of the circuit part. That is, some of the display element regions DDR may overlap with the first region DCA, and the display elements provided in the display element regions DDR overlapping with the first region DCA may be disposed on the first region DCA.

The display elements and the pixel circuits may be connected through bridge patterns BRP. When the bridge patterns BRP connect the display elements and the pixel circuits, some of the bridge patterns BRP do not have a single linear shape but may have a detoured shape. Therefore, the lengths of the bridge patterns BRP may be equal or similar to one another.

If the lengths of the bridge patterns BRP are different from one another, loads of the bridge patterns BRP may be different from one another. If the loads of the bridge patterns BRP are different from one another, RC delays of the bridge patterns BRP may be different from one another.

However, in the embodiment of the present disclosure, the lengths of the bridge patterns BRP are equal or similar to one another, and thus the RC delays of the bridge patterns BRP can be equal or similar to one another.

Figure 23:
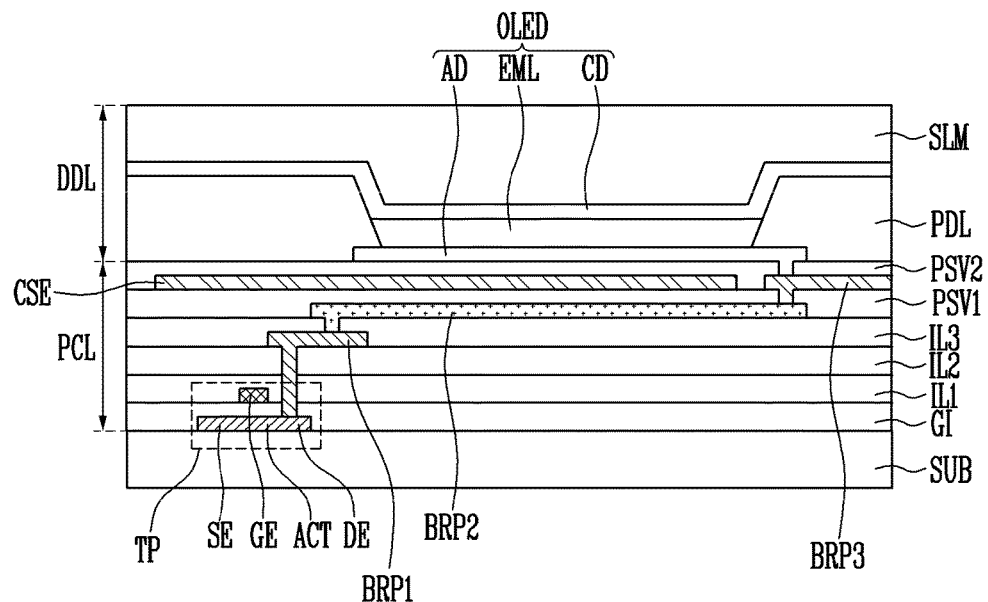
FIG. 23 is a sectional view illustrating a display device according to still another embodiment of the present disclosure.

FIG. 23 is a sectional view illustrating a display device according to still another embodiment of the present disclosure.

Referring to FIG. 23, the display device may include a substrate SUB, a circuit part PCL provided on the substrate SUB, and a display element part DDL disposed on the circuit part PCL.

The circuit part PCL may include at least one transistor TP. The display element part DDL may include a display element region in which a display element OLED is disposed. The display element OLED may be connected to the transistor TP. The display element OLED and a pixel circuit may be connected through at least one bridge pattern BRP.

Hereinafter, a structure of the display device according to the embodiment of the present disclosure will be described along a stacking order with reference to FIG. 23.

A transistor TP may be disposed on a substrate SUB. The transistor TP may be the seventh transistor T7 shown in FIGS. 7 to 9.

The transistor TP may include a source electrode SE, a drain electrode DE, and a gate electrode GE. The source electrode SE and the drain electrode DE may be integrally provided with an active pattern ACT. For example, the source electrode SE and the drain electrode DE may be formed of a semiconductor layer doped with an impurity, and the active pattern ACT may be formed of a semiconductor layer undoped with the impurity. Here, a channel of the transistor TP may be formed in the active pattern ACT.

A gate insulating layer GI may be disposed over the source electrode SE, the active pattern ACT, and the drain electrode DE.

The gate electrode GE may be disposed on the gate insulating layer GI.

A first interlayer insulating layer IL1 and a second interlayer insulating layer IL2, which are sequentially stacked, may be disposed on the gate insulating layer GI on which the gate electrode GE is disposed.

A first bridge pattern BRP1 connected to the source electrode SE through a contact hole may be disposed on the second interlayer insulating layer IL2. The first bridge pattern BRP1 may include the same material as the data line Dj, the connection line CNL, and the auxiliary connection line AUX, which are shown in FIGS. 7 to 9. In addition, the contact hole may be the seventh contact hole CH7 shown in FIGS. 7 to 9.

A third interlayer insulating layer IL3 may be disposed on the second interlayer insulating layer IL2 on which the first bridge pattern BRP1 is disposed.

A second bridge pattern BRP2 connected to the first bridge pattern BRP1 through a contact hole may be disposed on the third interlayer insulating layer IL3.

A first protective layer PSV1 may be disposed on the third interlayer insulating layer IL3 on which the second bridge pattern BRP2 is disposed.

A third bridge pattern BRP3 connected to the second bridge pattern BRP2 through a contact hole passing through the first protective layer PSV1 and a coupling shield electrode CSE for decreasing the parasitic capacitance of a parasitic capacitor due to overlapping between lines may be disposed on the first protective layer PSV1. The third bridge pattern BRP3 and the coupling shield electrode CSE may be disposed to be spaced apart from each other. The coupling shield electrode CSE may overlap the second bridge pattern BRP3 and a first electrode AD which will be described hereinafter.

A second protective layer PSV2 may be disposed on the first protective layer PSV1 on which the third bridge pattern BRP3 and the coupling shield electrode CSE are disposed, and a display element OLED may be disposed on the second protective layer PSV2.

The display element OLED may include a first electrode AD disposed on the protective layer PSV, a light emitting layer EML disposed on the first electrode AD, and a second electrode CD disposed on the light emitting layer EML.

The first electrode AD is disposed on the protective layer PSV, and may be connected to the third bridge pattern BRP3 through a contact hole passing through the protective layer PSV. Thus, the first electrode AD can be electrically connected to the source electrode SE through the first bridge pattern BRP1, the second bridge pattern BRP2, and the third bridge pattern BRP3. That is, the display element OLED can be electrically connected to the source electrode SE through the first bridge pattern BRP1, the second bridge pattern BRP2, and the third bridge pattern BRP3.

In this embodiment, a constant voltage may be applied to the coupling shield electrode CSE. For example, one of the initialization power source Vint, the first power source ELVDD, and the second power source ELVSS, which are shown in FIGS. 5 and 6, may be applied to the coupling shield electrode CSE.

A parasitic capacitor may be formed between the first electrode AD and the second bridge pattern BRP2. The capacitance of the parasitic capacitor increases a load of the second bridge pattern BRP2, thereby increasing an RC delay of the second bridge pattern BRP2.

However, if the constant voltage is applied to the coupling shield electrode CSE, the parasitic capacitor between the first electrode AD and the second bridge pattern BRP2 may be divided into a parasitic capacitor between the first electrode AD and the coupling shield electrode CSE and a parasitic capacitor between the coupling shield electrode CSE and the second bridge pattern BRP2. The parasitic capacitors divided by the coupling shield electrode CSE are connected in series to each other, and the sum of capacitances of the capacitors connected in series can decrease. Thus, the coupling shield electrode CSE can decrease the parasitic capacitance of the parasitic capacitor formed between the first electrode AD and the second bridge pattern BRP2.

Figure 24:
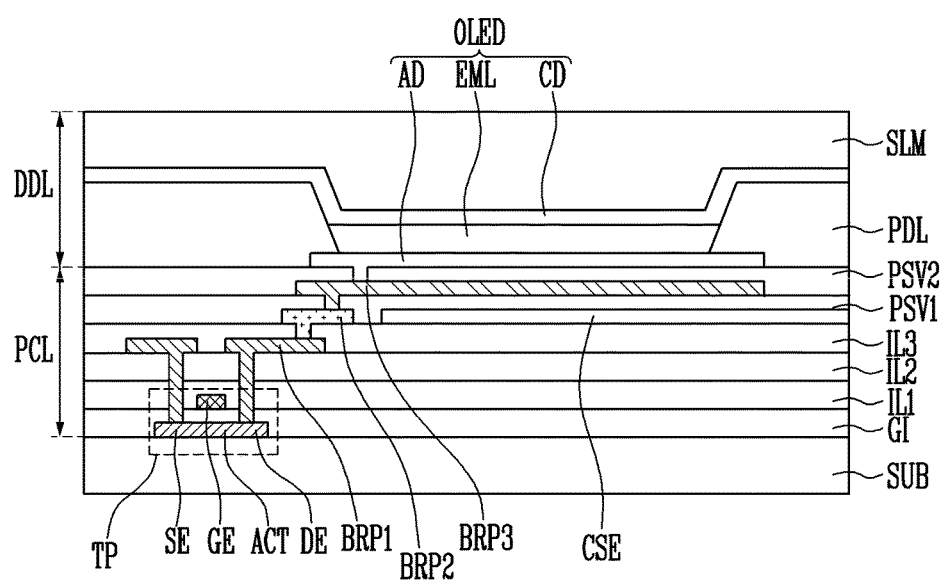
FIG. 24 is a sectional view illustrating a display device according to still another embodiment of the present disclosure.

FIG. 24 is a sectional view illustrating a display device according to still another embodiment of the present disclosure.

Referring to FIG. 24, the display device may include a substrate SUB, a circuit part PCL provided on the substrate SUB, and a display element part DDL disposed on the circuit part PCL. The circuit part PCL may include at least one transistor TP. The display element part DDL may include a display element region in which a display element OLED is disposed. The display element OLED may be connected to the transistor TP. The display element OLED and a pixel circuit may be connected through at least one bridge pattern BRP.

Hereinafter, a structure of the display device according to the embodiment of the present disclosure will be described along a stacking order with reference to FIG. 24.

A transistor TP may be disposed on a substrate SUB. The transistor TP may be the seventh transistor T7 shown in FIGS. 7 to 9.

The transistor TP may include a source electrode SE, a drain electrode DE, and a gate electrode GE. The source electrode SE and the drain electrode DE may be integrally provided with an active pattern ACT. For example, the source electrode SE and the drain electrode DE may be formed of a semiconductor layer doped with an impurity, and the active pattern ACT may be formed of a semiconductor layer undoped with the impurity. Here, a channel of the transistor TP may be formed in the active pattern ACT.

A gate insulating layer GI may be disposed over the source electrode SE, the active pattern ACT, and the drain electrode DE.

The gate electrode GE may be disposed on the gate insulating layer GI.

A first interlayer insulating layer IL1 and a second interlayer insulating layer IL2, which are sequentially stacked, may be disposed on the gate insulating layer GI on which the gate electrode GE is disposed.

A first bridge pattern BRP1 connected to the source electrode SE through a contact hole may be disposed on the second interlayer insulating layer IL2. The first bridge pattern BRP1 may include the same material as the data line Dj, the connection line CNL, and the auxiliary connection line AUX, which are shown in FIGS. 7 to 9. In addition, the contact hole may be the seventh contact hole CH7 shown in FIGS. 7 to 9.

A third interlayer insulating layer IL3 may be disposed on the second interlayer insulating layer IL2 on which the first bridge pattern BRP1 is disposed.

A second bridge pattern BRP2 connected to the first bridge pattern BRP1 through a contact hole and a coupling shield electrode CSE for decreasing the parasitic capacitance of a parasitic capacitor due to overlapping between lines may be disposed on the third interlayer insulating layer IL3. The second bridge pattern BRP2 and the coupling shield electrode CSE may be disposed to be spaced apart from each other. The coupling shield electrode CSE may overlap a third bridge pattern which will be described hereinafter.

A first protective layer PSV1 may be disposed on the third interlayer insulating layer IL3 on which the second bridge pattern BRP2 and the coupling shield electrode CSE are disposed.

A third bridge pattern BRP3 connected to the second bridge pattern BRP2 through a contact hole passing through the first protective layer PSV1 may be disposed on the first protective layer PSV1.

A second protective layer PSV2 may be disposed on the first protective layer PSV1 on which the third bridge pattern BRP3 is disposed, and a display element OLED may be disposed on the second protective layer PSV2.

The display element OLED may include a first electrode AD disposed on the second protective layer PSV2, a light emitting layer EML disposed on the first electrode AD, and a second electrode CD disposed on the light emitting layer EML.

The first electrode AD is disposed on the second protective layer PSV2, and may be connected to the third bridge pattern BRP3 through a contact hole passing through the second protective layer PSV2. Thus, the first electrode AD can be electrically connected to the source electrode SE through the first bridge pattern BRP1, the second bridge pattern BRP2, and the third bridge pattern BRP3. That is, the display element OLED can be electrically connected to the source electrode SE through the first bridge pattern BRP1, the second bridge pattern BRP2, and the third bridge pattern BRP3.

In this embodiment, a constant voltage may be applied to the coupling shield electrode CSE. For example, one of the initialization power source Vint, the first power source ELVDD, and the second power source ELVSS, which are shown in FIGS. 5 and 6, may be applied to the coupling shield electrode CSE.

A parasitic capacitor may be formed between the first electrode AD and the third bridge pattern BRP3. The capacitance of the parasitic capacitor increases a load of the third bridge pattern BRP3, thereby increasing an RC delay of the third bridge pattern BRP3.

However, if the constant voltage is applied to the coupling shield electrode CSE, the parasitic capacitor between the first electrode AD and the third bridge pattern BRP3 may be divided into a parasitic capacitor between the first electrode AD and the coupling shield electrode CSE and a parasitic capacitor between the coupling shield electrode CSE and the third bridge pattern BRP3. The parasitic capacitors divided by the coupling shield electrode CSE are connected in series to each other, and the sum of capacitances of the capacitors connected in series can decrease. Thus, the coupling shield electrode CSE can decrease the parasitic capacitance of the parasitic capacitor formed between the first electrode AD and the third bridge pattern BRP3.

In the display device according to the present disclosure, display elements can be disposed even on a first region. That is, a display region in which the display elements are disposed can extend onto the first region. Thus, it is possible to increase the area of the display region in which images can be implemented in the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a circuit part including at least one first region having a driving unit and at least one second region disposed adjacent to the first region, wherein the second region includes first pixel circuits arranged adjacent to the first region and second pixel circuits spaced apart from the first region;
a display element part including first display elements and second display elements, the display element part being disposed on the circuit part, wherein the first display elements are electrically connected to the first pixel circuits and overlap with the first region, and the second display elements are electrically connected to the second pixel circuits; and
bridge patterns disposed between the circuit part and the display element part, the bridge patterns electrically connecting the first and second pixel circuits to the first and second display elements,
wherein the length of bridge patterns connecting the first pixel circuits to the first display elements is different from that of bridge patterns connecting the second pixel circuits to the second display elements.

2. The display device of claim 1, wherein the length of the bridge patterns connecting the first pixel circuits to the first display elements is greater than that of the bridge patterns connecting the second pixel circuits to the second display elements.

3. The display device of claim 2, wherein, as the distance between the first pixel circuits and the first display elements increases, the length of the bridge patterns increases.

4. The display device of claim 3, further comprising dummy patterns connected to the respective bridge patterns, wherein the length of the dummy patterns is in inverse proportion to that of the bridge patterns.

5. The display device of claim 2, wherein the bridge patterns connecting the second pixel circuits to the second display elements have the same length.

6. A display device comprising:
a substrate;
a circuit part including at least one first region having a driving unit and at least one second region disposed adjacent to the first region, wherein the second region includes first pixel circuits arranged adjacent to the first region and second pixel circuits spaced apart from the first region;
a display element part including first display elements and second display elements, the display element part being disposed on the circuit part, wherein the first display elements are electrically connected to the first pixel circuits and overlap with the first region, and the second display elements are electrically connected to the second pixel circuits; and
first bridge patterns disposed between the circuit part and the display element part, the bridge patterns electrically connecting the first and second pixel circuits to the first and second display elements,
wherein the first and second pixel circuits have at least one transistor, the transistor includes a semiconductor layer disposed on the substrate and a gate electrode disposed on a gate insulating layer formed on the semiconductor layer, and the semiconductor layer includes a source electrode, a drain electrode, and an active pattern disposed between the source electrode and the drain electrode,
wherein the circuit part includes:
first and second interlayer insulating layers covering the transistor, the first and second interlayer insulating layers being sequentially stacked;
connection patterns disposed on the second interlayer insulating layer, the connection patterns being connected to the transistor; and
a third interlayer insulating layer disposed over the connection patterns,
wherein the first bridge patterns are disposed on the third interlayer insulating layer and connected to the transistor through the connection patterns.

7. The display device of claim 6, wherein the length of first bridge patterns connecting the transistor of the first pixel circuits to the first display elements is different from that of first bridge patterns connecting the transistor of the second pixel circuits to the second display elements.

8. The display device of claim 7, wherein the length of the first bridge patterns connecting the transistor of the first pixel circuits to the first display elements is greater than that of the first bridge patterns connecting the transistor of the second pixel circuits to the second display elements.

9. The display device of claim 8, wherein, as the distance between the transistor of the first pixel circuits and the first display elements increases, the length of the first bridge patterns increases.

10. The display device of claim 7, further comprising:
a first protective layer disposed on the first bridge patterns; and
second bridge patterns disposed on the first protective layer, the second bridge patterns being connected to the first bridge patterns.

11. The display device of claim 10, further comprising a coupling shield electrode disposed on the third interlayer insulating layer, the coupling shield electrode being spaced apart from the first bridge patterns, the coupling shield electrode having a constant voltage applied thereto.

12. The display device of claim 10, further comprising a coupling shield electrode disposed on the first protective layer, the coupling shield electrode being spaced apart from the second bridge patterns, the coupling shield electrode having a constant voltage applied thereto.

13. A display device comprising:
a substrate;
a circuit part including at least one first region having a driving unit and at least one second region, the circuit part being disposed on the substrate, wherein the at least one second region includes pixel circuit regions in which pixel circuits are arranged, and the at least one first region is disposed adjacent to the second region;
a display element part disposed on the circuit part, the display element part including a plurality of display element regions in which display elements are arranged, the display element part having at least a portion disposed on the first region; and
bridge patterns disposed between the circuit part and the display element part, the bridge patterns electrically connecting the pixel circuits to the display elements,
wherein the area of at least one of the pixel circuit regions is smaller than that of the display element regions.

14. The display device of claim 13, wherein the pixel circuit regions include first pixel circuit regions adjacent to the first region and second pixel circuit regions spaced apart from the first region,
wherein the area of the first pixel circuit regions is smaller than that of the display element regions.

15. The display device of claim 14, wherein the area of the first pixel circuit regions is smaller than that of the second pixel circuit regions.

16. The display device of claim 15, wherein the width or length of the second pixel circuit regions is greater than that of the first pixel circuit regions.

17. The display device of claim 14, wherein at least one of the display element regions does not overlap the first pixel circuit regions corresponding thereto in a plan view.

18. The display device of claim 17, wherein the display element regions arranged on the first region do not overlap the corresponding first pixel circuit regions.

19. The display device of claim 18, wherein the width or length of the display element regions is greater than that of the first pixel circuit regions.

20. The display device of claim 14, wherein the area of the first pixel circuit regions is equal to that of the second pixel circuit regions.

21. The display device of claim 20, wherein the width or length of the display element regions is greater than that of the pixel circuit regions.

22. The display device of claim 14, wherein the second region includes first pixel circuits disposed in the first pixel circuit regions and second pixel circuits disposed in the second pixel circuit regions,
wherein the length of bridge patterns connecting the first pixel circuits to the display elements is different from that of bridge patterns connecting the second pixel circuits to the display elements.

23. The display device of claim 22, wherein the length of the bridge patterns connecting the first pixel circuits to the display elements is greater than that of the bridge patterns connecting the second pixel circuits to the display elements.

24. The display device of claim 23, wherein, as the distance between the first pixel circuits and the display elements increases, the length of the bridge patterns increases.

25. The display device of claim 24, further comprising dummy patterns connected to the respective bridge patterns,
wherein the length of the dummy patterns is in inverse proportion to that of the bridge patterns.

26. The display device of claim 14, wherein all of the bridge patterns have the same length.

27. A display device comprising:
a substrate;
a circuit part including at least one first region having a driving unit and at least one second region, the circuit part being disposed on the substrate, wherein the at least one second region includes pixel circuit regions in which pixel circuits are arranged, and the at least one first region is disposed adjacent to the second region;
a display element part disposed on the circuit part, the display element part including a plurality of display element regions in which display elements are arranged, the display element part having at least a portion disposed on the first region; and
first bridge patterns disposed between the circuit part and the display element part, the bridge patterns electrically connecting the pixel circuits to the display elements,
wherein the pixel circuits have at least one transistor, the transistor includes a semiconductor layer disposed on the substrate and a gate electrode disposed on a gate insulating layer formed on the semiconductor layer, and the semiconductor layer includes a source electrode, a drain electrode, and an active pattern disposed between the source electrode and the drain electrode,
wherein the circuit part includes:
first and second interlayer insulating layers covering the transistor, the first and second interlayer insulating layers being sequentially stacked;
connection patterns disposed on the second interlayer insulating layer, the connection patterns being respectively connected to the transistors of the pixel circuits; and
a third interlayer insulating layer disposed on the connection patterns,
wherein the first bridge patterns are disposed on the third interlayer insulating layer and connected to the connection patterns.

28. The display device of claim 27, wherein the pixel circuit regions include first pixel circuit regions adjacent to the first region and second pixel circuit regions spaced apart from the first region,
wherein the second region includes first pixel circuits disposed in the first pixel circuit regions and second pixel circuits disposed in the second pixel circuit regions,
wherein the length of first bridge patterns connecting the first pixel circuits and the display elements is different from that of first bridge patterns connecting the second pixel circuits and the display elements.

29. The display device of claim 28, wherein the length of the first bridge patterns connecting the first pixel circuits to the display elements is greater than that of the first bridge patterns connecting the second pixel circuits to the display elements.

30. The display device of claim 29, wherein, as the distance between the first pixel circuits and the display elements increases, the length of the first bridge patterns increases.

31. The display device of claim 27, further comprising:
a first protective layer disposed over the first bridge patterns; and
second bridge patterns disposed on the first protective layer, the second bridge patterns being connected to the first bridge patterns.

32. The display device of claim 31, further comprising a coupling shield electrode disposed on the third interlayer insulating layer, the coupling shield electrode being spaced apart from the first bridge patterns.

33. The display device of claim 32, wherein a constant voltage is applied to the coupling shield electrode.

34. The display device of claim 31, further comprising a coupling shield electrode disposed on the first protective layer, the coupling shield electrode being spaced apart from the second bridge patterns.

35. The display device of claim 34, wherein a constant voltage is applied to the coupling shield electrode.

36. A display device comprising:
a substrate;
a circuit part including a first region having a driving unit and a second region, the second region including pixel circuits;
a display element part disposed on the circuit part, the display element part having display elements, at least one of the display elements being disposed on the first region; and
bridge patterns disposed between the circuit part and the display element part, the bridge patterns electrically connecting the pixel circuits to the display elements, respectively,
wherein at least one of the bridge patterns crosses border between adjacent display elements.

37. The display device of claim 36, wherein a length of a bridge pattern connected to the display element disposed on the first region is longer than that connected to the display element disposed on the second region.

38. The display device of claim 37, wherein at least two display elements are disposed on the first region, and
wherein, as a distance between the second region and the display element disposed on the first region increases, the length of the bridge patterns increases.

39. The display device of claim 38, further comprising dummy patterns connected to the bridge patterns,
wherein lengths of the dummy patterns are in inverse proportion to those of the bridge patterns.

* * * * *